United States Patent
Ito

(10) Patent No.: US 7,238,609 B2
(45) Date of Patent: Jul. 3, 2007

(54) METHOD FOR FABRICATING SEMICONDUCTOR DEVICE

(75) Inventor: Toyoji Ito, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 274 days.

(21) Appl. No.: 10/786,070

(22) Filed: Feb. 26, 2004

(65) Prior Publication Data

US 2004/0166668 A1 Aug. 26, 2004

(30) Foreign Application Priority Data

Feb. 26, 2003 (JP) .............................. 2003-048807

(51) Int. Cl.
*H01L 21/4763* (2006.01)

(52) U.S. Cl. .................. 438/640; 438/666; 438/701; 438/713; 438/978

(58) Field of Classification Search ................ 438/640, 438/666, 701, 713, 978, FOR. 458, FOR. 355, 438/FOR. 492, 353, 396, 386, 387, 637
See application file for complete search history.

(56) References Cited

U.S. PATENT DOCUMENTS

| | | | | | |
|---|---|---|---|---|---|
| 4,814,041 | A | * | 3/1989 | Auda ........................... | 438/712 |
| 5,354,386 | A | * | 10/1994 | Cheung et al. ............. | 148/33.3 |
| 5,663,091 | A | * | 9/1997 | Yen et al. .................... | 438/600 |
| 5,700,708 | A | * | 12/1997 | Chen et al. .................. | 438/253 |
| 6,051,859 | A | | 4/2000 | Hosotani et al. | |
| 6,239,461 | B1 | | 5/2001 | Lee | |
| 6,274,457 | B1 | * | 8/2001 | Sakai et al. ................. | 438/424 |
| 6,399,495 | B1 | | 6/2002 | Tseng et al. | |
| 6,660,580 | B2 | * | 12/2003 | Lee ............................. | 438/240 |
| 6,774,032 | B1 | * | 8/2004 | Park ............................ | 438/640 |
| 6,831,323 | B2 | * | 12/2004 | Ito et al. ..................... | 257/306 |
| 2001/0054731 | A1 | * | 12/2001 | Takahashi ................... | 257/306 |
| 2002/0061654 | A1 | * | 5/2002 | Kanegae et al. ............ | 438/710 |

FOREIGN PATENT DOCUMENTS

| | | |
|---|---|---|
| JP | 61-296722 A | 12/1986 |
| JP | 63-122125 | 5/1988 |
| JP | 01-268042 | 10/1989 |
| JP | 01-287948 | 11/1989 |
| JP | 05-090420 | 4/1993 |
| JP | 08-139293 | 5/1996 |
| JP | 2000-124427 | 4/2000 |
| JP | 2002-231905 | 8/2002 |

* cited by examiner

*Primary Examiner*—George R. Fourson
*Assistant Examiner*—John M. Parker
(74) *Attorney, Agent, or Firm*—McDermott Will & Emery LLP

(57) ABSTRACT

A method for fabricating a semiconductor device has the steps of forming a conductive film on a substrate, forming an insulating film such that the conductive film is covered with the insulating film, forming, in the insulating film, a hole having a bottom portion not reaching the conductive film by using a mask layer having a first opening pattern, and forming, in the insulating film, an opening for exposing the conductive film by using a mask layer having a second opening pattern having an opening diameter larger than an opening diameter of the first opening pattern. An obtuse angle is formed between a wall surface of the opening and a bottom surface of the opening.

29 Claims, 17 Drawing Sheets

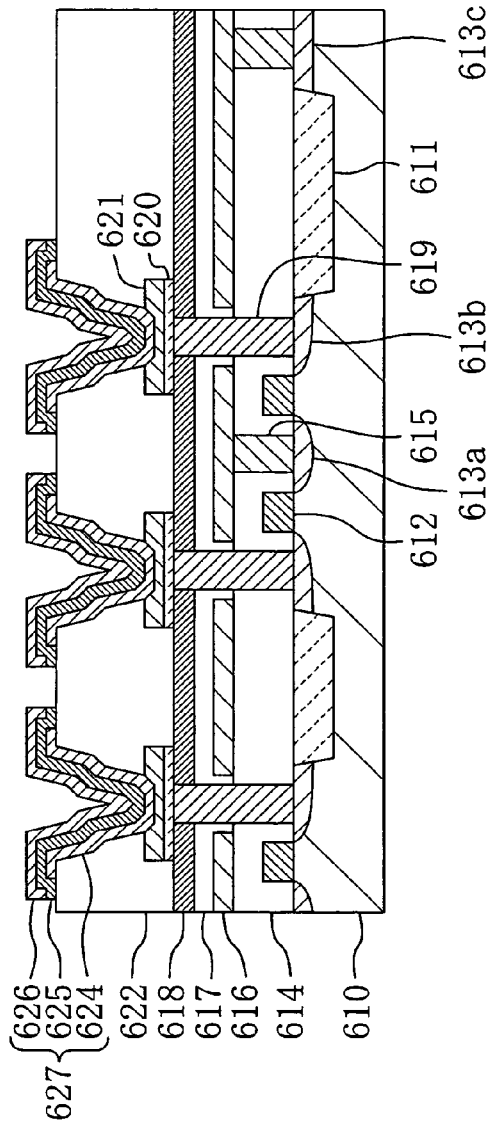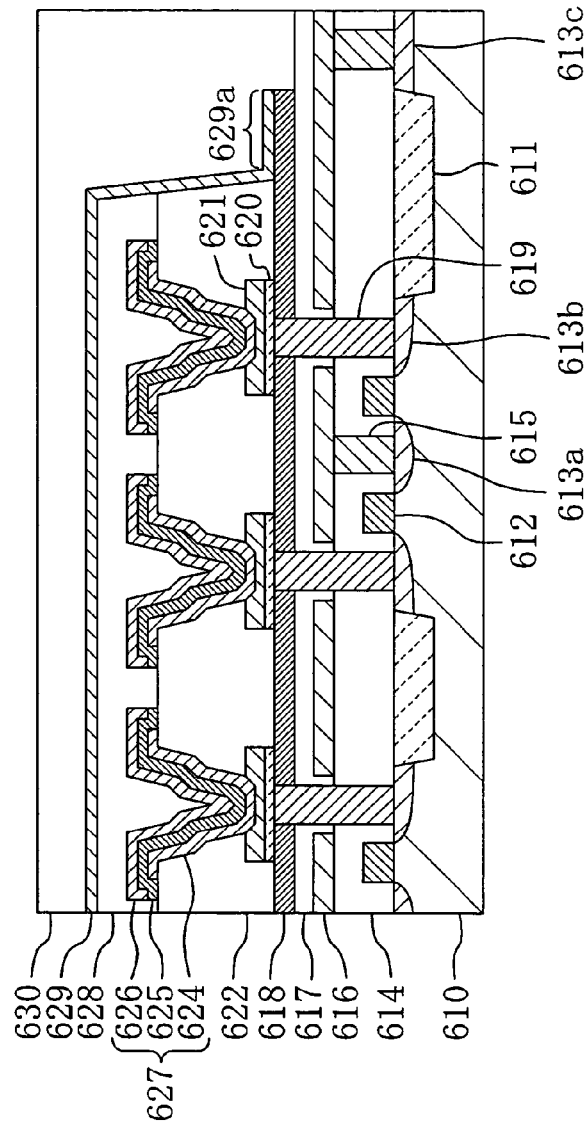
FIG. 14A
FIG. 14B

METHOD FOR FABRICATING SEMICONDUCTOR DEVICE

BACKGROUND OF THE INVENTION

The present invention relates to a method for fabricating a semiconductor device having a capacitor.

A semiconductor device having a capacitor which uses a ferroelectric film or a high dielectric film as a capacitor insulating film has a remanent polarization resulting from a hysteresis characteristic or a high specific dielectric constant. In the field of a nonvolatile memory and a DRAM, therefore, a possibility is that a capacitor using a ferroelectric film or a high dielectric film as a capacitor insulating film will be used widely as a replacement for a capacitor having a capacitor insulating film composed of a silicon oxide film or a silicon nitride film. In this case, a capacitor is requested to have a three-dimensional configuration for a further reduction in the area of a memory cell.

A conventional method for fabricating a semiconductor device will be described herein below with reference to FIGS. 16A to 16C and FIGS. 17A to 17C.

First, as shown in FIG. 16A, a first silicon oxide film 11 is formed by CVD on a semiconductor substrate 10 and then planarized by CMP. Then, selective dry etching is performed with respect to the first silicon oxide film 11 to form a contact hole for exposing the semiconductor substrate 10. Subsequently, a titanium film and a titanium nitride film are formed by sputtering or CVD in such a manner as to fill in the contact hole and a tungsten film is further formed by CVD.

Next, a metal film composed of the titanium film, the titanium nitride film, and the tungsten film is left only in the contact hole by CMP to form a plug 12. Then, a multilayer film composed of a titanium-aluminum nitride film, an iridium film, and an iridium oxide film which are stacked successively in layers are formed by sputtering over the first silicon oxide film 11 and the plug 12. Subsequently, selective dry etching is performed with respect to the multilayer film, thereby forming an oxygen barrier film 13 covering the plug 12.

Next, as shown in FIG. 16B, a second silicon oxide film 14 is formed over the first silicon oxide film 11 in such a manner as to cover the oxygen barrier film 13 and then planarized by CMP. Then, as shown in FIG. 16C, a resist mask 15 having an opening pattern 15a above the oxygen barrier layer 13 is formed on the second silicon oxide film 14.

Next, as shown in FIG. 17A, etching is performed with respect to the second silicon oxide film 14 by using the resist mask 15 having the opening pattern 15a, thereby forming an opening 14a for exposing the oxygen barrier film 13. In this case, the oxygen barrier film 13 is over etched and the film thickness of the resist mask 15 is reduced by etching.

Next, as shown in FIG. 17B, the remaining resist mask 15 is removed by ashing. Then, as shown in FIG. 17C, a first platinum film is formed by sputtering over the second silicon oxide film 14 and in the opening 14a. Subsequently, selective dry etching is performed with respect to the first platinum film in a region including the opening 14a, thereby forming a lower electrode 16 composed of the patterned first platinum film. Then, a ferroelectric film composed of a bismuth layer-structured Perovskite-type oxide, the components of which are strontium, bismuth, tantalum, and niobium, is formed by MOCVD over the second silicon oxide film 14 and the lower electrode 16. After a second platinum film is then formed by sputtering on the ferroelectric film, the ferroelectric film and the second platinum film are patterned in a region including the lower electrode 16, whereby a capacitor insulating film 17 and an upper electrode 18 are formed. Thereafter, wiring, a protective film, and the like are formed, though they are not disclosed.

In accordance with the foregoing fabrication method, however, the coverage of the lower electrode 16, the capacitor insulating film 17, and the upper electrode 18 composing a capacitor is insufficient so that the cross section of the capacitor is likely to have an overhung configuration. Consequently, a broken wire may occur in the lower electrode 16 or in the upper electrode 18. In addition, the film thickness of the capacitor becomes smaller with approach toward the bottom portion of the wall surface of the opening 14a, while the film thickness of the capacitor is also reduced at the bottom portion of the opening 14a. Since the coverage is insufficient, variations occur in the characteristics of the capacitor if the thickness of the capacitor insulating film 17 becomes nonuniform.

There are cases where the lower electrode, the capacitor insulating film, and the upper electrode, which are formed when the opening has a vertical configuration in accordance with another conventional method for fabricating a semiconductor device, are not shown in such an inferior coverage condition as shown in FIG. 17C. If sputtering which allows simple and convenient film formation for the upper electrode, the lower electrode, or the capacitor insulating film is used, however, coverage deteriorates in the opening in an actual situation (see, e.g., U.S. Pat. No. 6,239,461, column 5 line 44 to column 6 line 26, FIG. 5). Even if MOCVD (Metal Organic CVD) which relatively improves the coverage is used, coverage is insufficient in practice and the new problem of a lower film-forming rate is encountered if the coverage is to be improved by using the method.

To improve the coverage of the electrodes and the capacitor insulating film, a method of forming the wall surface of the opening into a downwardly tapered configuration when viewed from above (it is assumed hereinafter that, if any mention is made of the configuration of the wall surface in the following description, it refers to a configuration viewed from above). To form an extremely small opening in a silicon oxide film used typically as an interlayer insulating film, it is necessary to form the opening by dry etching. However, reactive etching cannot be performed with respect to a silicon oxide film so that it is difficult to form the wall surface of the opening into a downwardly tapered configuration.

As a method for forming the wall surface of an opening into a downwardly tapered configuration, there has been proposed a method which retracts a resist mask after forming an opening and performs etching again to form the wall surface of the opening into a downwardly tapered configuration (see, e.g., Japanese Laid-Open Patent Publication No. SHO 61-296722, pp. 2 to 3, FIG. 1). In this case, however, an underlying conductive film removed by etching for forming the opening is adhered again to the sidewall of the resist mask used for etching or a reaction product between an etching gas and the conductive film is deposited. The re-adhered conductive film and the reaction product remaining unremoved even after the retraction of the resist mask causes configurational abnormality such as the formation of a fence. In the case of performing etching again, therefore, the configurational abnormality hinders stable formation of the tapered configuration of the wall surface of the opening.

Thus, in accordance with the conventional method for fabricating a semiconductor device, the coverage of the electrodes and the capacitor insulating film is insufficient and the cross sections thereof are likely to present overhung configurations. If the coverage of the electrodes deteriorates, a broken wire occurs in the electrode. If the electrodes present overhung configurations, the width of the space in the upper portion of the opening is reduced so that the coverage of the capacitor insulating film is further degraded. This leads to a leakage current flowing in the capacitor insulating film and variations in the characteristics of the capacitor.

In the case of forming the capacitor insulating film by MOCVD (Metal Organic CVD), on the other hand, the raw materials of organic metals are supplied at nonuniform rates so that the composition of the capacitor insulating film becomes nonuniform. In addition, a method for stably forming the tapered configuration of the wall surface of the opening is unknown.

SUMMARY OF THE INVENTION

In view of the foregoing, it is therefore an object of the present invention to stably form the wall surface of an opening into a tapered configuration and thereby improve the coverage of electrodes and a capacitor insulating film.

To attain the object, a first method for fabricating a semiconductor device according to the present invention comprises the steps of: forming a conductive film on a substrate; forming an insulating film such that the conductive film is covered with the insulating film; forming, in the insulating film, a hole having a bottom portion not reaching the conductive film by using a mask layer having a first opening pattern; and forming, in the insulating film, an opening for exposing the conductive film by using a mask layer having a second opening pattern having an opening diameter larger than an opening diameter of the first opening pattern, an obtuse angle being formed between a wall surface of the opening and a bottom surface of the opening.

Since the first method for fabricating a semiconductor device forms the hole not reaching the conductive film by the first etching using the mask having the first opening pattern and then exposes the conductive film by the second etching using the mask having the second opening pattern having the opening diameter larger than that of the first opening pattern to form the opening, there is no such a situation that the conductive film is adhered again to the sidewall of the mask having the first opening pattern and a reaction product between an etching gas and the conductive film is deposited on the sidewall of the mask having the first opening pattern so that configurational abnormality, such as the formation of a fence, which has been observed in a conventional embodiment does not occur. Accordingly, the configuration of the wall surface of the opening can be formed smoothly and stably.

Preferably, the first method for fabricating a semiconductor device further comprises the step of: forming, at least in the opening, a capacitor element composed of a lower electrode, a capacitor insulating film, and an upper electrode.

The arrangement allows the formation of the electrodes and the capacitor insulating film which are excellent in coverage and prevents a broken wire in the electrode as well as a leakage current and a compositional deviation in the capacitor insulating film, thereby preventing variations in the characteristics of the capacitor element.

In the first method for fabricating a semiconductor device, the step of forming the capacitor element preferably includes the steps of: forming the lower electrode such that the wall surface of the opening and the bottom surface of the opening are covered with the lower electrode; forming the capacitor insulating film on the lower electrode; and forming the upper electrode on the capacitor insulating film.

In the first method for fabricating a semiconductor device, each of the lower electrode and the upper electrode may appropriately contains a platinum group element as a main component.

In the first method for fabricating a semiconductor device, the capacitor insulating film is preferably composed of a ferroelectric film or a high dielectric film.

In the first method for fabricating a semiconductor device, the capacitor insulating film is preferably composed of $SrBi_2(Ta_xNb_{1-x})_2O_9$, $Pb(Zr_xTi_{1-x})O_3$, $(Ba_xSr_{1-x})TiO_3$, $(Bi_xLa_{1-x})_4Ti_3O_{12}$ (where X satisfies a relationship represented by $0 \leq x \leq 1$), or $Ta_2O_5$.

In the first method for fabricating a semiconductor device, if the conductive film is composed of iridium, platinum, gold, ruthenium, rhodium, palladium, or a metal oxide thereof or alternatively composed of titanium, titanium-aluminum, tantalum, tantalum-aluminum, a nitride thereof, or a multilayer film composed thereof, the re-adhesion of the conductive film removed by the etching to the mask can be suppressed and the deposition of the reaction product between the etching gas and the conductive film on the mask can be suppressed.

In the first method for fabricating a semiconductor device, if the conductive film contains an oxygen barrier film connected to the substrate via a plug, there is no such a situation that the plug is oxidized during the formation of the capacitor insulating film. This allows a connection between the capacitor element and the substrate.

In the first method for fabricating a semiconductor device, if the insulating film is an oxide film containing silicon, highly anisotropic etching can be performed with respect to the insulating film. By forming the opening by the second etching after forming the depressed portion by the first etching, therefore, a level difference at the wall surface of the opening is reduced and a smoothly tapered configuration is obtained.

In the first method for fabricating a semiconductor device, if the insulating film has a planarized principal surface, a focus shift in the mask used in forming the electrodes and the capacitor insulating film is reduced.

In the first method for fabricating a semiconductor device, if the mask is a photoresist, the etching selectivity of the photoresist to the insulating film can be maintained sufficiently high.

A second method for fabricating a semiconductor device according to the present invention comprises the steps of: forming a conductive film on a specified region of a substrate; forming an insulating film on the substrate such that the conductive film is covered with the insulating film; forming, on the insulating film, a mask layer having a first opening pattern above the conductive film; performing first etching with respect to the insulating film by using the mask layer having the first opening pattern to form, in the insulating film, a depressed portion having a bottom portion not reaching the conductive film; forming a mask layer having a second opening pattern having an opening diameter larger than an opening diameter of the first opening pattern by enlarging the opening diameter of the first opening pattern; and performing second etching with respect to the insulating film by using the mask layer having the second opening pattern to form, in the insulating film, an opening for exposing the conductive film such that the opening has a diameter larger than a diameter of the depressed portion and a wall surface having a tapered configuration.

Since the second method for fabricating a semiconductor device forms the depressed portion not reaching the conductive film by the first etching using the mask having the first opening pattern and then exposes the conductive film by the second etching using the mask having the second opening pattern having the opening diameter larger than that of the first opening pattern to form the opening, there is no such a situation that the conductive film is adhered again to the sidewall of the mask having the first opening pattern and a reaction product between an etching gas and the conductive film is deposited on the sidewall of the mask having the first opening pattern so that configurational abnormality, such as the formation of a fence, which has been observed in a conventional embodiment does not occur. Accordingly, the tapered configuration of the sidewall of the opening can be formed stably.

Preferably, the second method for fabricating a semiconductor device further comprises the step of: forming, at least in the opening, a capacitor element composed of a lower electrode, a capacitor insulating film, and an upper electrode.

The arrangement allows the formation of the electrodes and the capacitor insulating film which are excellent in coverage and prevents a broken wire in the electrode as well as a leakage current and a compositional deviation in the capacitor insulating film, thereby preventing variations in the characteristics of the capacitor element.

In the second method for fabricating a semiconductor device, the step of forming the capacitor element preferably includes the steps of forming the lower electrode such that the wall surface of the opening and the bottom surface of the opening are covered with the lower electrode; forming the capacitor insulating film on the lower electrode; and forming the upper electrode on the capacitor insulating film.

Preferably, the second method for fabricating a semiconductor device further comprises, between the step of forming the mask having the first opening pattern and the step of forming the depressed portion in the insulating film, the step of: forming a wall surface of the first opening pattern into a tapered configuration.

Since the arrangement performs the first etching after forming the wall surface of the first opening pattern into a tapered configuration, the wall surface of the opening can be processed into a more tapered configuration.

Preferably, the second method for fabricating a semiconductor device further comprises, after the step of forming the opening in the insulating film, the step of: after removing the mask, performing third etching with respect to an entire surface of the insulating film to smooth the tapered configuration of the wall surface of the opening.

The arrangement allows the wall surface of the opening to have a smoothly tapered configuration.

Preferably, the second method for fabricating a semiconductor device further comprises, after the step of forming the opening in the insulating film, the steps of: forming a mask layer having a third opening pattern having an opening diameter larger than the opening diameter of the second opening pattern by enlarging the opening diameter of the second opening pattern; and performing third etching with respect to the insulating film by using the mask layer having the third opening pattern to smooth the tapered configuration of the wall surface of the opening.

The arrangement allows the wall surface of the opening to have a smoothly tapered configuration.

Preferably, the foregoing method for fabricating a semiconductor device further comprises, after the step of smoothing the tapered configuration of the wall surface of the opening, the step of: forming, at least in the opening, a capacitor element composed of a lower electrode, a capacitor insulating film, and an upper electrode.

The arrangement allows the formation of the electrodes and the capacitor insulating film which are excellent in coverage and prevents a broken wire in the electrode as well as a leakage current and a compositional deviation in the capacitor insulating film, thereby preventing variations in the characteristics of the capacitor element.

In the foregoing method for fabricating a semiconductor device, the step of forming the capacitor element preferably includes the steps of: forming the lower electrode such that the wall surface of the opening and the bottom surface of the opening are covered with the lower electrode; forming the capacitor insulating film on the lower electrode; and forming the upper electrode on the capacitor insulating film.

A third method for fabricating a semiconductor device according to the present invention comprises the steps of: forming a conductive film on a specified region of a substrate; forming an etching stopper film on the conductive film; forming an insulating film on the substrate such that the etching stopper film is covered with the insulating film; forming, on the insulating film, a mask layer having a first opening pattern above the conductive film; performing first etching with respect to the insulating film by using the mask layer having the first opening pattern to form, in the insulating film, a depressed portion having a bottom portion not reaching the etching stopper film; forming a mask layer having a second opening pattern having an opening diameter larger than an opening diameter of the first opening pattern by enlarging the opening diameter of the first opening pattern; performing second etching with respect to the insulating film by using the mask layer having the second opening pattern to form, in the insulating film, an opening for exposing the etching stopper film such that the opening has a diameter larger than a diameter of the depressed portion and a wall surface having a tapered configuration; and performing third etching with respect to the etching stopper film to transfer the opening of the insulating film to the etching stopper film and thereby form, in the etching stopper film, an opening for exposing the conductive film, while smoothing the tapered configuration of the wall surface of the opening of the insulating film.

Since the third method for fabricating a semiconductor device forms the depressed portion not reaching the etching stopper film by the first etching using the mask having the first opening pattern and then forms the opening by the second etching using the mask having the second opening pattern having the opening diameter larger than that of the first opening pattern, there is no such a situation that the conductive film is adhered again to the sidewall of the mask having the first opening pattern and a reaction product between an etching gas and the conductive film is deposited on the sidewall of the mask having the first opening pattern so that configurational abnormality, such as the formation of a fence, which has been observed in a conventional embodiment does not occur. Accordingly, the tapered configuration of the sidewall of the opening can be formed stably. In contrast to the second method for fabricating a semiconductor device, the third method for fabricating a semiconductor device prevents the conductive film from being exposed in the opening formed by the second etching by forming the etching stopper film on the conductive film. This allows the wall surface of the opening to have a more smoothly tapered configuration through the third etching and suppresses an amount of over etching performed with respect to the conductive film during the third etching.

Preferably, the third method for fabricating a semiconductor device further comprises the step of: forming a capacitor element composed of a lower electrode, a capacitor insulating film, and an upper electrode at least in the opening of the insulating film and in the opening of the etching stopper film.

The arrangement allows the formation of the electrodes and the capacitor insulating film which are excellent in coverage and prevents a broken wire in the electrode as well as a leakage current and a compositional deviation in the capacitor insulating film, thereby preventing variations in the characteristics of the capacitor element.

In the third method for fabricating a semiconductor device, the step of forming the capacitor element preferably includes the steps of: forming the lower electrode such that the wall surface of the opening and the bottom surface of the opening are covered with the lower electrode; forming the capacitor insulating film on the lower electrode; and forming the upper electrode on the capacitor insulating film.

In the third method for fabricating a semiconductor device, the third etching is preferably performed after removing the mask.

The arrangement prevents the mask from interfering with an etching gas used in the third etching and reduces a level difference produced at the wall surface of the opening through the first etching and the second etching so that the opening having a smoother wall surface is obtained.

In the third method for fabricating a semiconductor device, the third etching is preferably performed by using a mask layer having a third opening pattern formed by enlarging the opening diameter of the second opening pattern.

The arrangement reduces a level difference produced at the wall surface of the opening through the first etching and the second etching and provides the opening having a smooth wall surface.

Preferably, each of the second to fourth methods for fabricating semiconductor devices further comprises, between the step of forming the mask having the first opening pattern and the step of forming the depressed portion in the insulating film, the step of: forming a wall surface of the first opening pattern into a tapered configuration.

Since the arrangement performs the first etching after forming the wall surface of the first opening pattern into a tapered configuration, the wall surface of the opening can be processed into a more tapered configuration.

In the third method for fabricating a semiconductor device, the etching stopper film is preferably composed of a metal oxide containing titanium or aluminum.

The arrangement allows the etching selectivity of the metal oxide to the conductive film to be maintained high.

A fourth method for fabricating a semiconductor device according to the present invention comprises the steps of: forming a conductive film on a specified region of a substrate; forming an insulating film on the substrate such that the conductive film is covered with the insulating film; forming, on the insulating film, a mask layer having a first opening pattern above the conductive film; performing first etching with respect to the insulating film by using the mask layer having the first opening pattern to form, in the insulating film, a depressed portion having a bottom portion not reaching the conductive film; and, after removing the mask layer, performing second etching with respect to an entire surface of the insulating film to form, in the insulating film, an opening for exposing the conductive film such that the opening has a diameter larger than a diameter of the depressed portion and a wall surface having a tapered configuration.

Since the fourth method for fabricating a semiconductor device forms the depressed portion not reaching the conductive film by the first etching, removes the mask, and then forms the opening by the second etching, there is no such a situation that the conductive film is adhered again to the sidewall of the mask having the first opening pattern and a reaction product between an etching gas and the conductive film is deposited on the sidewall of the mask having the first opening pattern so that configurational abnormality, such as the formation of a fence, which has been observed in a conventional embodiment does not occur. Accordingly, the tapered configuration of the sidewall of the opening can be formed stably. In contrast to the second method for fabricating a semiconductor device, the fourth method for fabricating a semiconductor device allows the omission of the step of performing etching by using the mask having the second opening pattern obtained by enlarging the opening diameter of the first opening pattern and thereby achieves a reduction in the number of process steps.

Preferably, the fourth method for fabricating a semiconductor device further comprises the step of: forming, at least in the opening of the insulating film, a capacitor element composed of a lower electrode, a capacitor insulating film, and an upper electrode.

The arrangement allows the formation of the electrodes and the capacitor insulating film which are excellent in coverage and prevents a broken wire in the electrode as well as a leakage current and a compositional deviation in the capacitor insulating film, thereby preventing variations in the characteristics of the capacitor element.

In the fourth method for fabricating a semiconductor device, the step of forming the capacitor element preferably includes the steps of: forming the lower electrode such that the wall surface of the opening and the bottom surface of the opening are covered with the lower electrode; forming the capacitor insulating film on the lower electrode; and forming the upper electrode on the capacitor insulating film.

Preferably, the fourth method for fabricating a semiconductor device further comprises, between the step of forming the mask having the first opening pattern and the step of forming the depressed portion in the insulating film, the step of: forming a wall surface of the first opening pattern into a tapered configuration.

Since the arrangement performs the first etching after forming the wall surface of the first opening pattern into a tapered configuration, the wall surface of the opening can be processed into a more tapered configuration.

BRIEF DESCRIPTION OF THE DRAWINGS

FIGS. 14A and 14B are cross-sectional views each illustrating the method for fabricating the semiconductor device according to the sixth embodiment;

DETAILED DESCRIPTION OF THE INVENTION

Embodiment 1

A method for fabricating a semiconductor device according to a first embodiment of the present invention will be described with reference to FIGS. 1A to 1D and FIGS. 2A to 2D.

Figure 1A:
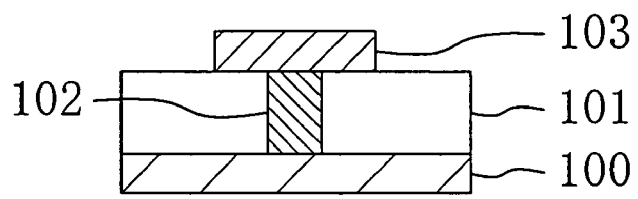
FIGS. 1A to 1D are cross-sectional views each illustrating a method for fabricating a semiconductor device according to a first embodiment of the present invention.

First, as shown in FIG. 1A, a first silicon oxide film 101 with a thickness of 1000 nm is formed by CVD on a semiconductor substrate 100. Then, the first silicon oxide film 101 is planarized by CMP till the thickness thereof becomes 500 nm. Subsequently, selective dry etching is performed with respect to the first silicon oxide film 101, thereby forming a contact hole having a diameter of 250 nm and connecting to the upper surface of the semiconductor substrate 100. Then, a titanium film with a thickness of 10 nm and a titanium nitride film with a thickness of 20 nm are formed successively over the first silicon oxide film 101 and in the contact hole and a tungsten film with a thickness of 200 nm is further formed by CVD.

Next, a metal film composed of the titanium film, the titanium nitride film, and the tungsten film is left only in the contact hole by CMP to form a plug 102. Then, by sputtering, a titanium-aluminum nitride film with a thickness of 100 nm, an iridium film with a thickness of 50 nm, and an iridium oxide film with a thickness of 100 nm are stacked successively in layers over the first silicon oxide film 101 and the plug 102, thereby forming a multilayer film. Subsequently, selective dry etching is performed with respect to the multilayer film, thereby forming an oxygen barrier film 103 covering the plug 102.

Here, the oxygen barrier film 103 is a conductive film.

In addition, although the case where the oxygen barrier film 103 is a conductive film is explained in this embodiment, this invention is not limited to such composition.

Figure 1B:
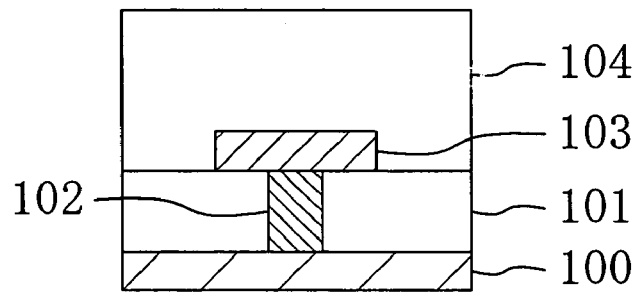

Next, as shown in FIG. 1B, a second silicon oxide film 104 with a thickness of 1000 nm is formed on the first silicon oxide film 101 in such a manner as to cover the oxygen barrier film 103. Then, the second silicon oxide film 104 is planarized by CMP till the film thickness above the oxygen barrier film 103 becomes 600 nm.

Figure 1C:
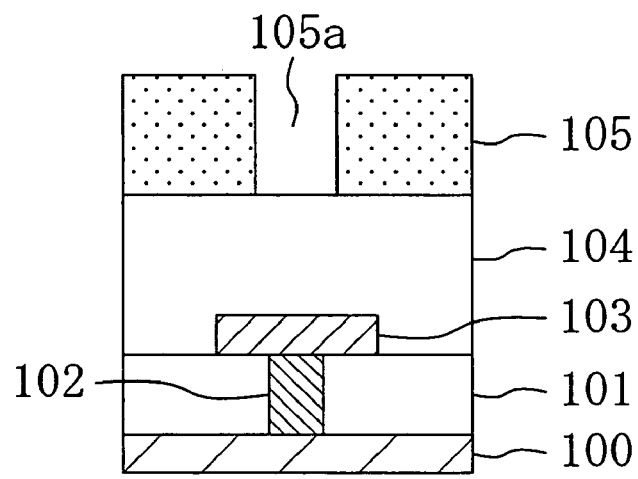

Next, as shown in FIG. 1C, a resist mask 105 having a first opening pattern 105a having a thickness of 700 nm above the oxygen barrier film 103 and an opening diameter of 300 nm is formed on the second silicon oxide film 104.

Figure 1D:
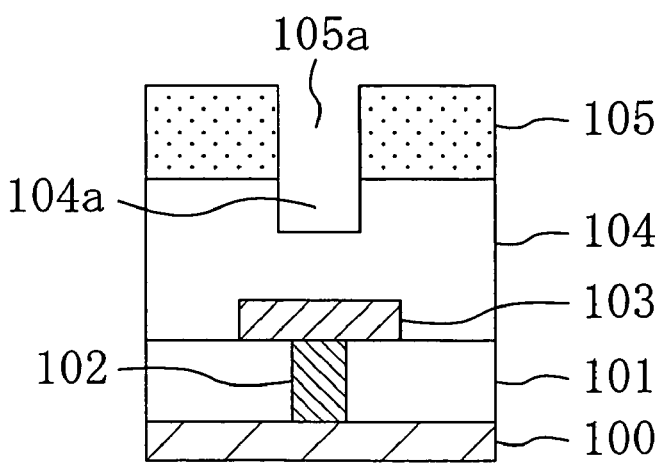

Next, as shown in FIG. 1D, first etching is performed with respect to the second silicon oxide film 104 by using the resist mask 105 having the first opening pattern 105a and a plasma composed of a gas mixture of a gas containing C, H, and F and a gas containing O, thereby forming a depressed portion 104a at a depth of about 300 nm. At this time, the film thickness of the resist mask 105 is reduced to about 500 nm by the first etching.

Figure 2A:
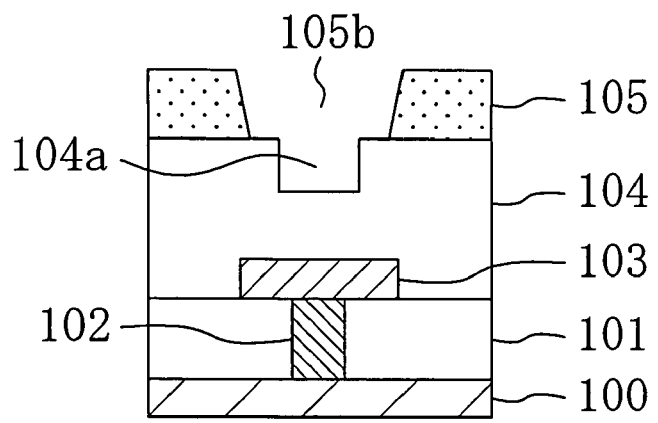
FIGS. 2A to 2D are cross-sectional views each illustrating the method for fabricating a semiconductor device according to the first embodiment.

Next, as shown in FIG. 2A, etching is performed with respect to the entire surface by using a plasma composed of a gas containing O to remove the portion of the resist mask 105 corresponding to a thickness of about 300 nm and thereby form the resist mask 105 having a second opening pattern 105b with an opening diameter of 400 nm. At this time, the wall surface of the second opening pattern 105b is formed into a downwardly tapered configuration because an upper portion of the resist mask 105 having the second opening pattern 105b is exposed more frequently to the plasma.

Figure 2B:
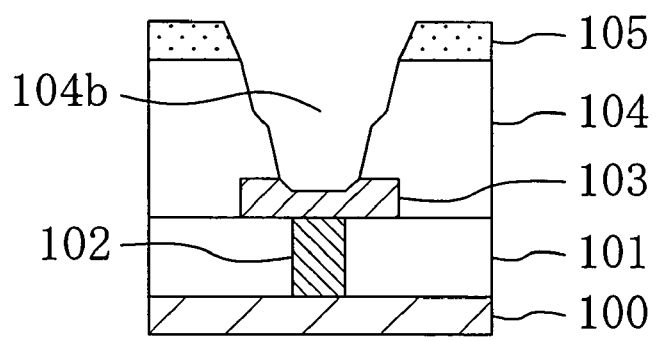

Next, as shown in FIG. 2B, second etching is performed with respect to the second silicon oxide film 104 having the depressed portion 104a by using the resist mask 105 having the second opening pattern 105b and a plasma composed of a gas mixture of a gas containing C, H, and F and a gas containing O, thereby forming an opening 104b for exposing the oxygen barrier film 103. The opening 104b has a diameter larger than that of the depressed portion 104a and a wall surface having a tapered configuration. In this case, the film thickness of the resist mask 105 is reduced to about 100 nm by the second etching, while the oxygen barrier film 103 is over etched by a thickness of about 30 nm.

Thus, the opening 104b is formed by the second etching after the depressed portion 104a is formed by the first etching so that, if the second etching is 100% anisotropic, a stepped portion is formed in the wall surface of the opening 104b. However, since the second etching is performed by using the resist mask 105 having the second opening pattern 105b obtained by enlarging the opening diameter of the first opening pattern 105a, the stepped portion is partly scraped off so that it presents a gently sloped configuration as shown in FIG. 2B. In addition, the tapered configuration of the second opening pattern 105b, which is transferred to the second silicon oxide film 104, also exerts an extra effect so that the opening 104b having a tapered wall surface is formed in the second silicon oxide film 104. An obtuse angle may be formed appropriately between the wall surface of the opening 104b and the bottom surface thereof The opening 104b is formed such that the wall surface thereof downwardly tapers from the top portion thereof toward the bottom portion thereof, i.e., such that the diameter of the opening 104b increases gradually from the bottom portion with approach toward the top portion.

Figure 2C:
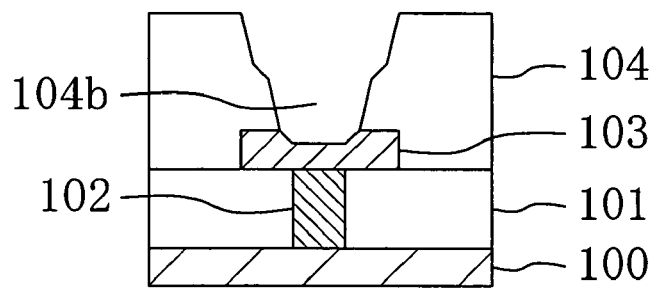

Next, as shown in FIG. 2C, the resist mask 105 is removed by ashing using a plasma composed of a gas containing O.

Figure 2D:
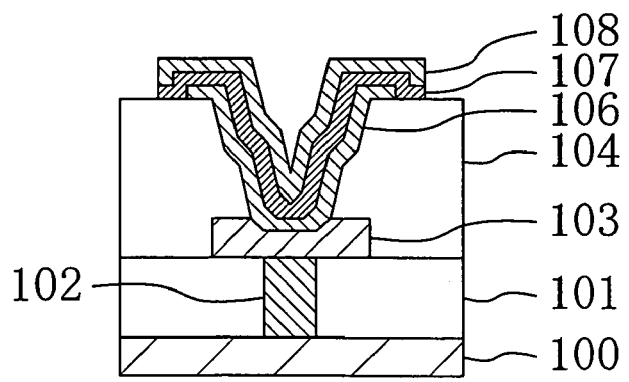

Next, as shown in FIG. 2D, a first platinum film with a thickness of 50 nm is formed by sputtering on the second silicon oxide film 104 including the inside of the opening 104b. Then, selective dry etching is performed with respect to the first platinum film in a region including the opening 104b, thereby forming a lower electrode 106 composed of the patterned first platinum film. Subsequently, a ferroelectric film composed of a bismuth layer-structured Perovskite-type oxide the components of which are strontium, bismuth, tantalum, and niobium is formed by MOCVD to a thickness of 50 nm over the second silicon oxide film 104 and the lower electrode 106. After a second platinum film with a thickness of 50 nm is then formed by sputtering on the ferroelectric film, the ferroelectric film and the second platinum film are patterned in a region including the lower electrode 106, whereby a capacitor insulating film 107 and an upper electrode 108 are formed. Thereafter, wiring, a protective film, and the like are formed on the capacitor, though they are not disclosed.

Thus, in accordance with the method for fabricating a semiconductor device according to the first embodiment, the depressed portion 104a is formed by the first etching using the resist mask 105 having the first opening pattern 105a and then the second etching is performed by using the resist mask 105 having the second opening pattern 105b having an opening diameter larger than that of the first opening pattern 105a. This allows the wall surface of the opening 104b formed in the second silicon oxide film 104 to be formed into a tapered configuration.

Since the oxygen barrier film 103 is prevented from being exposed when the depressed portion 104a is formed by the first etching, there is no such a situation that the iridium oxide in the upper layer of the multilayer film composing the oxygen barrier film 103 is adhered again to the sidewall of the resist mask 105 or a reaction product between fluorine and iridium is deposited on the sidewall of the resist mask 105 so that configurational abnormality, such as the formation of a fence, as has been observed in the conventional embodiment does not occur. This allows stable formation of the tapered configuration of the wall surface of the opening 104b.

Since the tapered configuration of the wall surface of the opening 104b can be formed stably, the resultant lower electrode 106, capacitor insulating film 107, and upper electrode 108 are excellent in coverage so that a broken wire in the electrode as well as a leakage current and a compositional deviation in the capacitor insulating film is prevented and variations in the characteristics of the capacitor are thereby prevented.

If a metal containing iridium, platinum, gold, ruthenium, rhodium, or palladium as a refractory metal or a metal oxide thereof is used in the upper layer of the multilayer film composing the oxygen barrier metal 103 or if titanium, titanium-aluminum, tantalum, tantalum-aluminum, a nitride thereof, or a multilayer film composed thereof is used in the upper layer of the multilayer film composing the oxygen barrier metal 103, the re-adhesion of the oxygen barrier film 103 removed by the second etching to the sidewall of the resist mask 105 can be suppressed and the deposition of a reaction product between an etching gas and the oxygen barrier film 103 on the sidewall of the resist mask 105 can also be suppressed.

Since the oxygen barrier film 103 connected to the semiconductor substrate 100 via the plug 102 is used as the underlying film of the lower electrode 106, the plug 102 is no more oxidized during the formation of the capacitor composed of a ferroelectric film or a high dielectric film, which allows a connection between the capacitor and the semiconductor substrate 100.

Since the second silicon oxide film 104 is an oxide film containing silicon as a main component, highly anisotropic etching can be performed with respect to the second silicon oxide film 104. By forming the opening 104b by the second etching after the formation of the depressed portion 104a by the first etching, the stepped portion in the wall surface of the opening 104b is reduced in level and a smoothly tapered configuration is obtained.

In addition, the planarization of the principal surface of the second silicon oxide film 104 reduces a focus shift in the resist mask 105 used in forming the capacitor element composed of the electrodes and the capacitor insulating film or a high dielectric film.

Since the resist mask 105 composed of a photoresist film is used as the mask, the etching selectivity of the resist mask 105 to the insulating film can be maintained sufficiently high.

Since the first etching is performed by using the plasma containing the oxygen gas, the etching selectivity of the resist mask 105 to the second silicon oxide film 104 can also be maintained sufficiently high.

Although the present embodiment has described the case where the capacitor is formed in the opening 104b, the present embodiment is not limited to the formation of the capacitor. Another element may also be formed instead.

Embodiment 2

A method for fabricating a semiconductor device according to a second embodiment of the present invention will be described with reference to FIGS. 3A to 3C and FIGS. 4A to 4C.

Figure 3A:
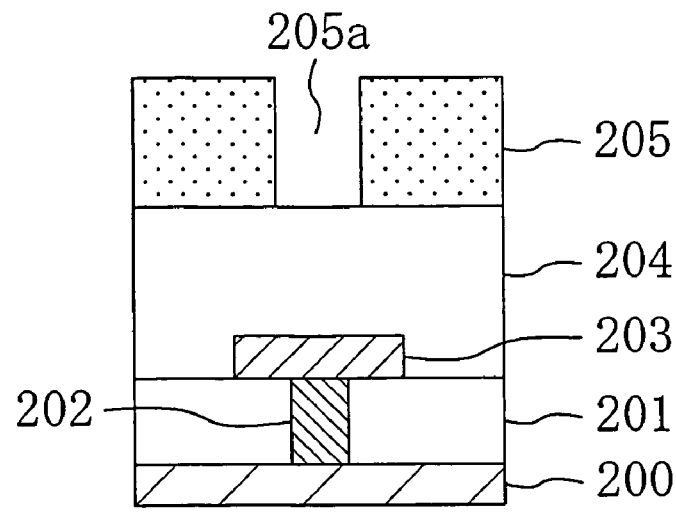
FIGS. 3A to 3C are cross-sectional views each illustrating a method for fabricating a semiconductor device according to a second embodiment of the present invention.

First, as shown in FIG. 3A, a first silicon oxide film 201, a plug 202, an oxygen barrier film 203, a second silicon oxide film 204, and a resist mask 205 having a first opening pattern 205a having a thickness of 700 nm and an opening diameter of 300 nm are formed on a semiconductor substrate 200 in the same manner as in the description-given with respect to FIGS. 1A to 1C in the first embodiment.

Figure 3B:
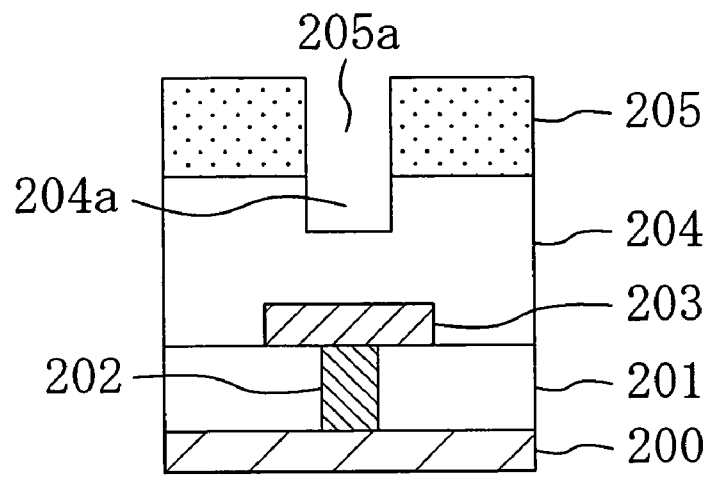

Next, as shown in FIG. 3B, first etching is performed with respect to the second silicon oxide film 204 by using the resist mask 205 having the first opening pattern 205a and a plasma composed of a gas mixture of a gas containing C, H, and F and a gas containing O, thereby forming a depressed portion 204a at a depth of about 300 nm. In this case, the film thickness of the resist mask 205 is reduced to about 500 nm by the first etching.

Figure 3C:
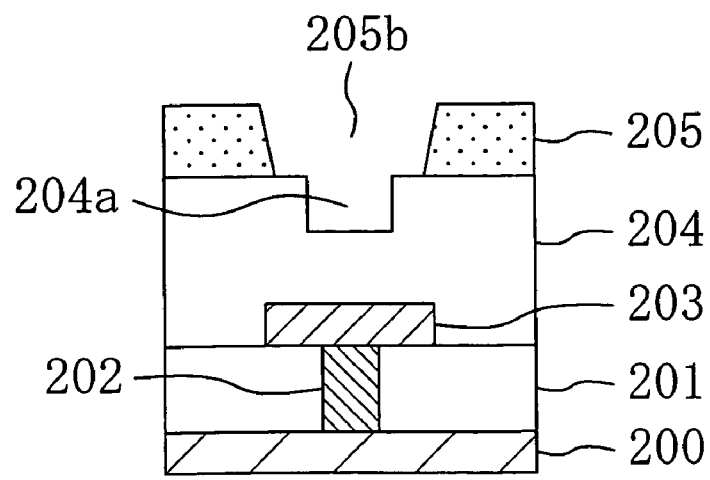

Next, as shown in FIG. 3C, etching using a plasma composed of a gas containing O is performed with respect to the entire surface, thereby removing the portion of the photoresist 205 corresponding to a thickness of about 300 nm and forming the resist mask 205 having a second opening pattern 205b having an opening diameter of 400 nm which is obtained by enlarging the opening diameter of the first opening pattern 205a. At this time, the cross section of the second opening pattern 205b is formed into a downwardly tapered configuration because an upper portion of the resist mask 205 having the second opening pattern 205b is more frequently exposed to the plasma.

Figure 4A:
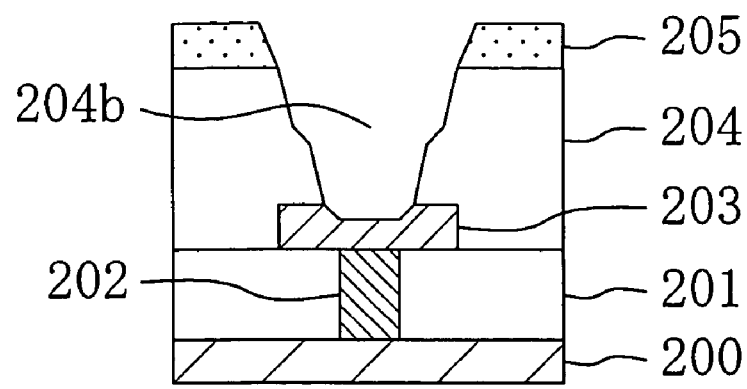
FIGS. 4A to 4C are cross-sectional views each illustrating the method for fabricating a semiconductor device according to the second embodiment.

Next, as shown in FIG. 4A, second etching is performed with respect to the second silicon oxide film 204 having the depressed portion 204a by using the resist mask 205 having the second opening pattern 205b and a plasma composed of a gas mixture of a gas containing C, H, and F and a gas containing O, thereby forming an opening 204b for exposing the oxygen barrier film 203. The opening 204b has a diameter larger than that of the depressed portion 204a and a wall surface having a tapered configuration. In this case, the film thickness of the resist mask 205 is reduced to about 100 nm by the second etching, while the oxygen barrier film 203 is over etched by a thickness of about 30 nm.

Thus, the opening 204b is formed by the second etching after the depressed portion 204a is formed by the first etching so that, if the second etching is 100% anisotropic, a stepped portion is formed in the wall surface of the opening 204b. However, since the second etching is performed by using having the second opening pattern 205b obtained by enlarging the opening diameter of the first opening pattern 205a, the stepped portion is partly scraped off so that it presents a gently sloped configuration as shown in FIG. 4A. In addition, the tapered configuration of the second opening pattern 205b, which is transferred to the second silicon oxide film 204, also exerts an extra effect so that the opening 204b having a tapered wall surface is formed in the second silicon oxide film 204.

Figure 4B:
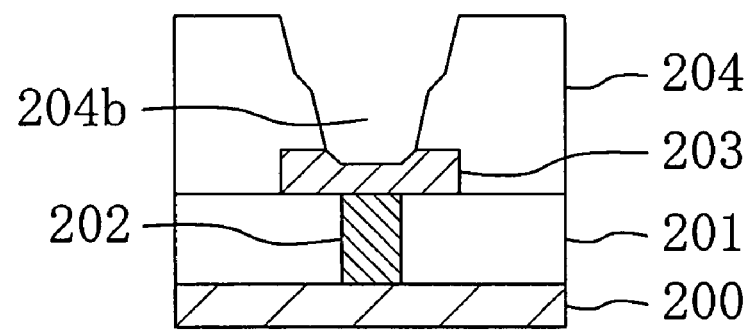

Next, as shown in FIG. 4B, the resist mask 205 is removed by ashing using a plasma composed of a gas containing O.

Figure 4C:
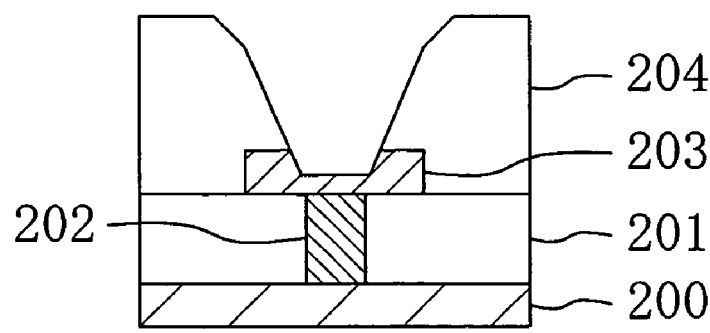

Next, as shown in FIG. 4C, third etching is performed entirely with respect to the second silicon oxide film 204 and the oxygen barrier film 203 exposed in the opening 204b without using a mask, thereby further reducing a level difference at the wall surface of the opening 204b. In this case, the oxygen barrier film 203 is over etched by a thickness of about 50 nm. Then, a lower electrode, a capacitor insulating film, and an upper electrode are formed in the same manner as in the first embodiment. Thereafter, wiring, a protective film, and the like are formed on the capacitor, though they are not disclosed.

Thus, in accordance with the method for fabricating a semiconductor device according to the second embodiment, the depressed portion 204a is formed by the first etching using the resist mask 205 having the first opening pattern 205a and then the second etching is performed by using the resist mask 205 having the second opening pattern 205b having an opening diameter larger than that of the first opening pattern 205a. This allows the wall surface of the opening 204b formed in the second silicon oxide film 204 to be formed into a downwardly tapered configuration.

Since the oxygen barrier film 203 is prevented from being exposed when the depressed portion 204a is formed by the first etching, there is no such a situation that the iridium oxide in the upper layer of the multilayer film composing the oxygen barrier film 203 is adhered again to the sidewall of the resist mask 205 or a reaction product between fluorine and iridium is deposited on the sidewall of the resist mask 205 so that configurational abnormality, such as the formation of a fence, as has been observed in the conventional embodiment does not occur. This allows stable formation of the tapered configuration of the wall surface of the opening 204b.

Since the third etching is performed with respect to the second silicon oxide film 204 having the opening 204b in which the oxygen barrier film 203 is exposed after the step of removing the resist mask 205 by ashing, the etching gas used in performing the third etching reaches the opening 204b without being interrupted by the mask so that the wall surface of the opening 204b formed after the first etching and the second etching are performed has a reduced level difference and a more smoothly tapered configuration. As a result, a lower electrode, a capacitor insulating film, and an upper electrode, which are more excellent in coverage, are obtainable so that a broken wire in the electrode as well as a leakage current and a compositional deviation in the capacitor insulating film is prevented and variations in the characteristics of the capacitor are thereby prevented.

Although the present embodiment has described the case where the third etching is performed with respect to the second silicon oxide film 204 having the opening 204b in which the oxygen barrier film 203 is exposed after the step of removing the resist mask 205 by ashing, the third etching may also be performed by using the resist mask 205 having an opening pattern obtained by enlarging the opening diameter of the second opening pattern 205b. In this case also, it will easily be appreciated that the wall surface of the opening 204b having a more smoothly tapered configuration is obtainable after the second etching.

If a metal containing iridium, platinum, gold, ruthenium, rhodium, or palladium as a refractory metal or a metal oxide thereof is used in the upper layer of the multilayer film composing the oxygen barrier metal 203 or if titanium, titanium-aluminum, tantalum, tantalum-aluminum, a nitride thereof, or a multilayer film composed thereof is used in the upper layer of the multilayer film composing the oxygen barrier metal 203, the re-adhesion of the oxygen barrier film 203 removed by the second etching to the sidewall of the resist mask 205 can be suppressed and the deposition of a reaction product between an etching gas and the oxygen barrier film 203 on the sidewall of the resist mask 205 can also be suppressed.

Since the oxygen barrier film 203 connected to the semiconductor substrate 200 via the plug 202 is used as the underlying film of the lower electrode, the plug 202 is no more oxidized during the formation of the capacitor insulating film composed of a ferroelectric film or a high dielectric film, which allows a connection between the capacitor and the semiconductor substrate 200.

Since the second silicon oxide film 204 is an oxide film containing silicon as a main component, highly anisotropic etching can be performed with respect to the second silicon oxide film 204. By forming the opening 204b by the second etching after the formation of the depressed portion 204a by the first etching, therefore, the stepped portion in the wall surface of the opening 204b is reduced in level and a smoothly tapered configuration is obtained.

In addition, the planarization of the principal surface of the second silicon oxide film 204 reduces a focus shift in the resist mask 205 used in forming the capacitor composed of the electrodes and the capacitor insulating film or a high dielectric film.

Since the resist mask 205 composed of a photoresist film is used as the mask, the etching selectivity of the resist mask 205 to the insulating film can be maintained sufficiently high.

Since the first etching is performed by using the plasma containing an oxygen gas, the etching selectivity of the resist mask 205 to the second silicon oxide film 204 can also be maintained sufficiently high.

Although the present embodiment has described the case where the capacitor is formed in the opening, the present embodiment is not limited to the formation of the capacitor. Another element may also be formed instead.

Embodiment 3

A method for fabricating a semiconductor device according to a third embodiment of the present invention will be described with reference to FIGS. 5A to 5C and FIGS. 6A to 6C.

Figure 5A:
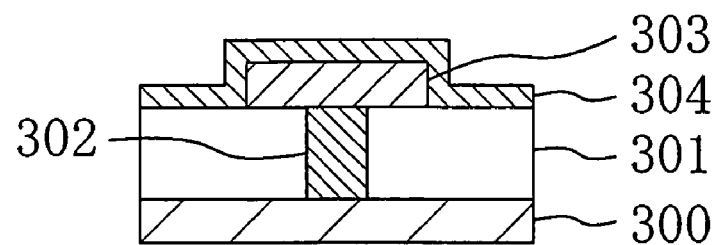
FIG. 5A to 5C are cross-sectional views each illustrating a method for fabricating a semiconductor device according to a third embodiment of the present invention.
Figure 5B:
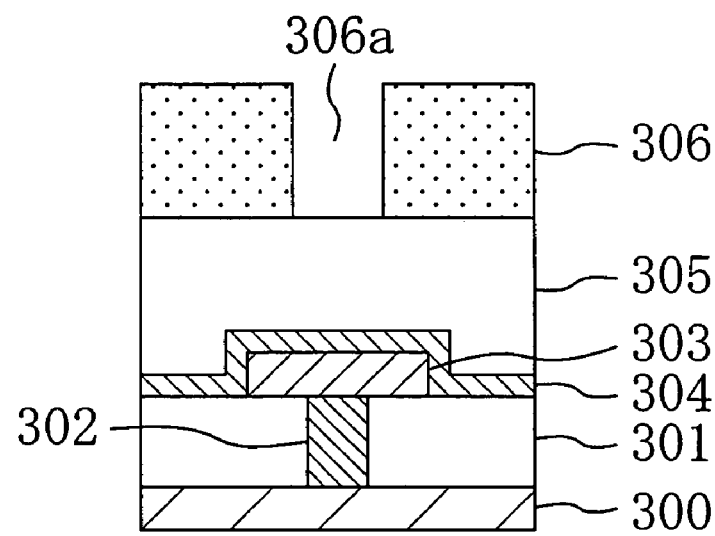

First, as shown in FIG. 5A, a first silicon oxide film 301, a plug 302, and an oxygen barrier film 303 are formed on a semiconductor substrate 300 in the same manner as in the description given with respect to FIG. 1A in the first embodiment. Then, an etching stopper film 304 composed of an aluminum titanium oxide and having a thickness of 50 nm is formed on the oxygen barrier film 303.

Next, a second silicon oxide film 305 and a resist mask 306 having a first opening pattern 306a having a thickness of 700 nm and an opening diameter of 300 nm are formed in the same manner as in the description given with respect to FIGS. 1B and 1C in the first embodiment.

Figure 5C:
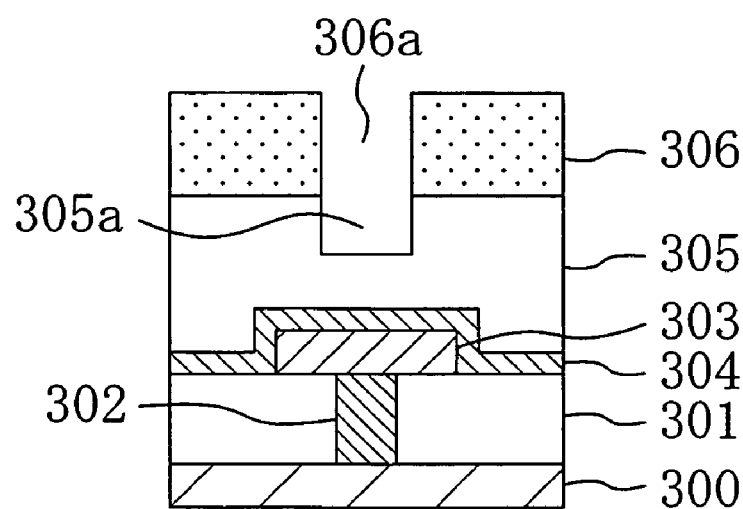

Next, as shown in FIG. 5C, first etching is performed with respect to the second silicon oxide film 305 by using the resist mask 306 having the first opening pattern 306a and a plasma composed of a gas mixture of a gas containing C, H, and F and a gas containing O, thereby forming a depressed portion 305a at a depth of about 300 nm. At this time, the film thickness of the resist mask 306 is reduced to about 500 nm by the first etching.

Figure 6A:
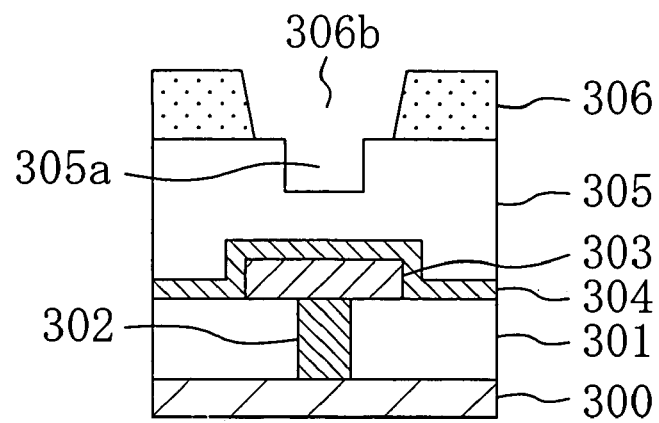
FIGS. 6A to 6D are cross-sectional views each illustrating the method for fabricating a semiconductor device according to the third embodiment.

Next, as shown in FIG. 6A, etching using a plasma composed of a gas containing O is performed with respect to the entire surface, thereby removing the portion of the photoresist 306 corresponding to a thickness of about 300 nm and forming the resist film 306 having a second opening pattern 306b having an opening diameter of 400 nm. At this time, the cross section of the second opening pattern 306b is formed into a downwardly tapered configuration because an upper portion of the resist mask 306 having the second opening pattern 306b is more frequently exposed to the plasma.

Figure 6B:
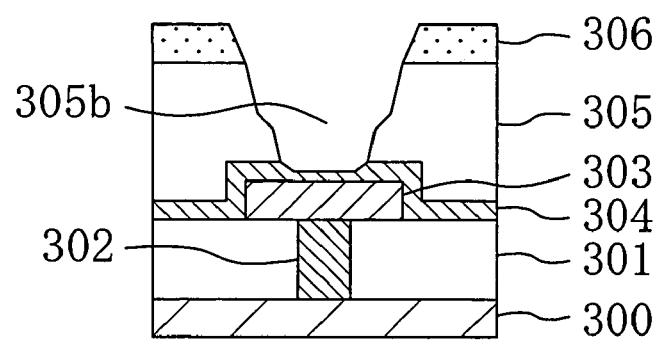

Next, as shown in FIG. 6B, second etching is performed with respect to the second silicon oxide film 305 having the depressed portion 305a by using the resist mask 306 having the second opening pattern 306b and a plasma composed of a gas mixture of a gas containing C, H, and F and a gas containing O, thereby forming an opening 305b for exposing the etching stopper film 304. The opening 305b has a diameter larger than that of the depressed portion 305a and a wall surface having a tapered configuration. In this case, the film thickness of the resist mask 306 is reduced to about 100 nm by the second etching, while the etching stopper film 304 is over etched by a thickness of about 30 nm.

Thus, the opening 305b is formed by the second etching after the depressed portion 305a is formed by the first etching so that, if the second etching is 100% anisotropic, a stepped portion is formed at the wall surface of the opening 305b. However, since the second etching is performed by using the mask having the second opening pattern 306b obtained by enlarging the opening diameter of the first opening pattern 306a, the stepped portion is partly scraped off so that it presents a gently sloped configuration as shown in FIG. 6B. In addition, the tapered configuration of the second opening pattern 306b, which is transferred to the second silicon oxide film 305, also exerts an extra effect so that the opening 305b having a tapered wall surface is formed in the second silicon oxide film 305.

Figure 6C:
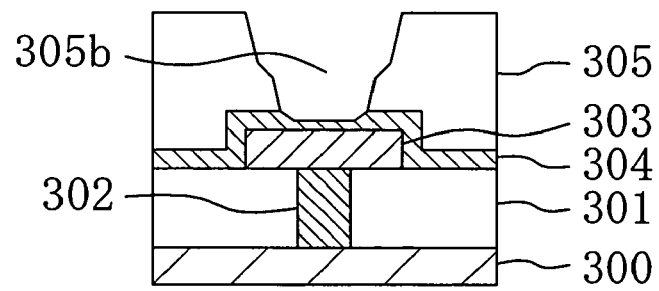

Next, as shown in FIG. 6C, the photoresist 306 is removed by ashing using a plasma composed of a gas containing O.

Figure 6D:
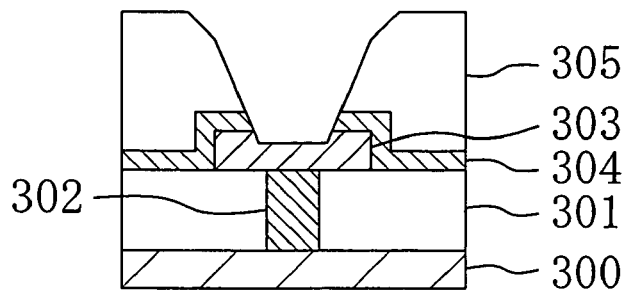

Next, as shown in FIG. 6D, third etching is performed by sputtering with respect to the entire surface of the second silicon oxide film 305 having the opening 305b in which the etching stopper film 304 is exposed without using a mask, thereby further reducing a level difference at the wall surface of the opening 305b. By the third etching, the opening 305b penetrates the etching stopper film 304 to expose the oxygen barrier film 303. On the other hand, the oxygen barrier film 303 is over etched by a thickness of about 10 nm. Then, a lower electrode, a capacitor insulating film, and an upper electrode are formed in the same manner as in the first embodiment. Thereafter, wiring, a protective film, and the like are formed, though they are not disclosed.

Thus, in accordance with the method for fabricating a semiconductor device according to the third embodiment, the depressed portion 305a is formed by the first etching using the resist mask 306 having the first opening pattern 306a and then the second etching is performed by using the resist mask 306 having the second opening pattern 306b having an opening diameter larger than that of the first opening pattern 306a. This allows the wall surface of the opening 305b formed in the second silicon oxide film 305 to be formed into a downwardly tapered configuration.

Since the oxygen barrier film 303 is prevented from being exposed when the depressed portion 305a is formed by the first etching, there is no such a situation that the iridium oxide in the upper layer of the multilayer film composing the oxygen barrier film 303 is adhered again to the sidewall of the resist mask 306 or a reaction product between fluorine and iridium is deposited on the sidewall of the resist mask 306 so that configurational abnormality, such as the formation of a fence, as has been observed in the conventional embodiment does not occur. This allows stable formation of the tapered configuration of the wall surface of the opening 305b.

In addition, the etching stopper film 304 formed on the oxygen barrier film 303 prevents the oxygen barrier film 303 from being exposed in the opening 305b formed by the second etching. This allows the wall surface of the opening 305b to have a more smoothly tapered configuration through the third etching and suppresses an amount of over etching performed with respect to the oxygen barrier film 303 during the third etching. As a result, a lower electrode, a capacitor insulating film, and an upper electrode, which are more excellent in coverage, are obtainable so that a broken wire in the electrode as well as a leakage current and a compositional deviation in the capacitor insulating film is prevented and variations in the characteristics of the capacitor are thereby prevented. In addition, the oxygen barrier film 303 is allowed to have a sufficiently large thickness so that a semiconductor device excellent in barrier property is fabricated.

By using an oxide containing titanium or aluminum, which is a low-melting metal, in the etching stopper film 304, the etching selectivity of the etching stopper film 304 to the oxide of iridium, which is a refractory metal in the upper layer of the multilayer film composing the oxygen barrier film 303 as the underlying film of the etching stopper film 304, can be maintained high.

Although the present embodiment has described the case where the third etching is performed with respect to the second silicon oxide film 305 having the opening 305b in which the etching stopper film 304 is exposed after the step of removing the resist mask 305 by ashing, the third etching may also be performed by using the resist mask 306 having an opening pattern obtained by enlarging the opening diameter of the second opening pattern 306b. In this case also, it will easily be appreciated that the wall surface of the opening 305b having a more smoothly tapered configuration is obtainable after the second etching.

Although the present embodiment has described the case where the third etching is performed with respect to the second silicon oxide film 305 having the opening 305b in which the oxygen barrier film 303 is exposed after the step of removing the resist mask 306 by ashing, the third etching may also be performed by using the resist mask 306 having an opening pattern obtained by enlarging the opening diameter of the second opening pattern 306b. In this case also, it will easily be appreciated that the wall surface of the opening 305b with a more smoothly tapered configuration is obtainable after the second etching. In this case, if a metal containing iridium, platinum, gold, ruthenium, rhodium, or palladium as a refractory metal or a metal oxide thereof is used in the upper layer of the multilayer film composing the oxygen barrier metal 303 or if titanium, titanium-aluminum, tantalum, tantalum-aluminum, a nitride thereof, or a multilayer film composed thereof is used in the upper layer of the multilayer film composing the oxygen barrier metal 303, the re-adhesion of the oxygen barrier film 303 removed by the third etching to the resist mask 306 can be suppressed and the deposition of a reaction product between an etching gas and the oxygen barrier film 303 on the resist mask 306 can also be suppressed.

Since the oxygen barrier film 303 connected to the semiconductor substrate 300 via the plug 302 is used as the underlying film of the lower electrode, the plug 302 is no more oxidized during the formation of the capacitor insulating film composed of a ferroelectric film or a high dielectric film, which allows a connection between the capacitor and the semiconductor substrate 300.

Since the second silicon oxide film 305 is an oxide film containing silicon as a main component, highly anisotropic etching can be performed with respect to the second silicon oxide film 305. By forming the opening 305b by the second etching after the formation of the depressed portion 305a by the first etching, therefore, the stepped portion at the wall surface of the opening 305b is reduced in level and a smoothly tapered configuration is obtained.

In addition, the planarization of the principal surface of the second silicon oxide film 305 reduces a focus shift in the resist mask 306 used in forming the capacitor composed of the electrodes and the capacitor insulating film or a high dielectric film.

Since the resist mask 306 composed of a photoresist film is used as the mask, the etching selectivity to the resist mask 306 can be maintained sufficiently high.

Since the first etching is performed by using the plasma containing an oxygen gas, the etching selectivity of the resist mask 306 to the second silicon oxide film 305 can also be maintained sufficiently high.

Although the present embodiment has described the case where the capacitor is formed in the opening, the present embodiment is not limited to the formation of the capacitor. Another element may also be formed instead.

Embodiment 4

A method for fabricating a semiconductor device according to a fourth embodiment of the present invention will be described with reference to FIGS. 7A and 7B and FIGS. 8A and 8B.

Figure 7A:
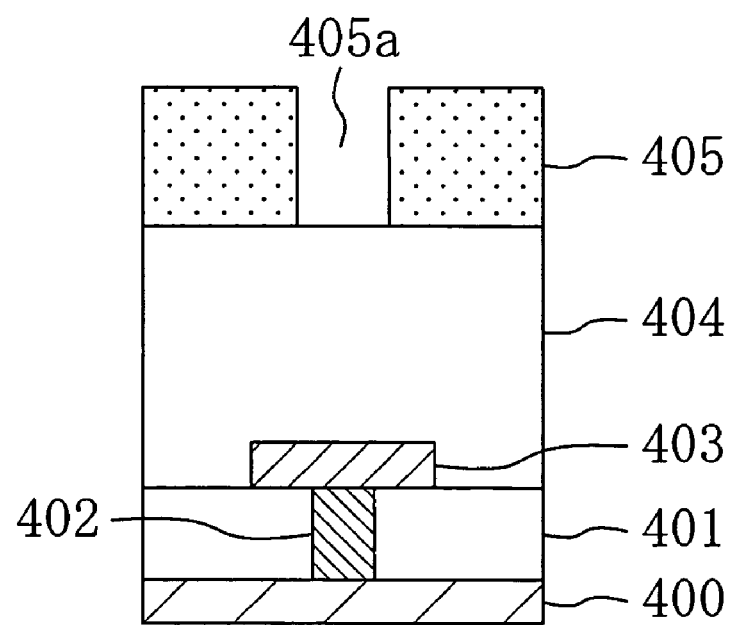
FIGS. 7A and 7B are cross-sectional views each illustrating a method for fabricating a semiconductor device according to a fourth embodiment of the present invention.

First, as shown in FIG. 7A, a first silicon oxide film 401, a plug 402, and an oxygen barrier film 403 are formed on a semiconductor substrate 400 in the same manner as in the description given with respect to FIGS. 1A to 1C in the first embodiment. Then, a second silicon oxide film 404 is formed over the first silicon oxide film 401 and the oxygen barrier film 403 in such a manner as to cover the oxygen barrier film 403. Subsequently, the second silicon oxide film 404 on the oxygen barrier film 403 is planarized by CMT till the thickness of the second silicon oxide film 404 becomes 900 nm. Then, a resist mask 405 having an opening pattern 405a having a thickness of 700 nm and an opening diameter of 300 nm is formed on the second silicon oxide film 404.

Figure 7B:
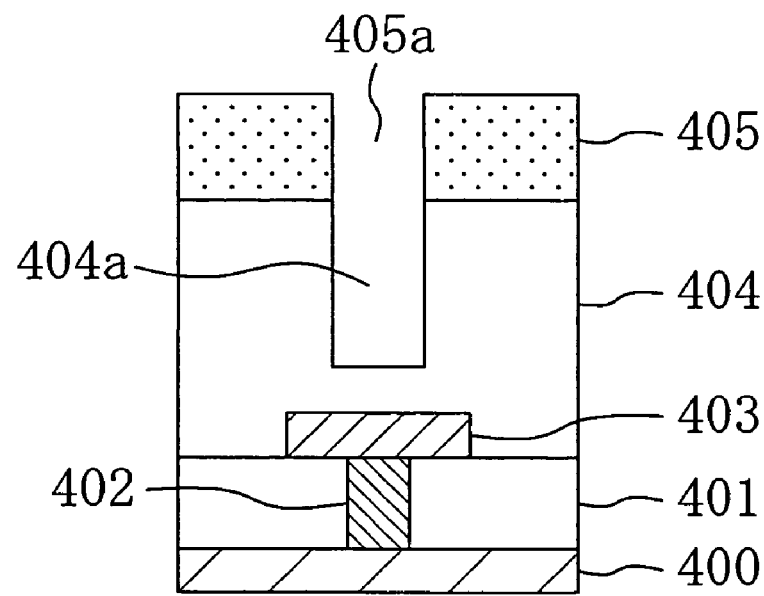

Next, as shown in FIG. 7B, first etching is performed by using the resist mask 405 having the opening pattern 405a and a plasma composed of a gas mixture of a gas containing C, H, and F and a gas containing O, thereby forming a depressed portion 404a at a depth of about 600 nm. In this case, the film thickness of the resist mask 405 is reduced to about 500 nm by the first etching.

Figure 8A:
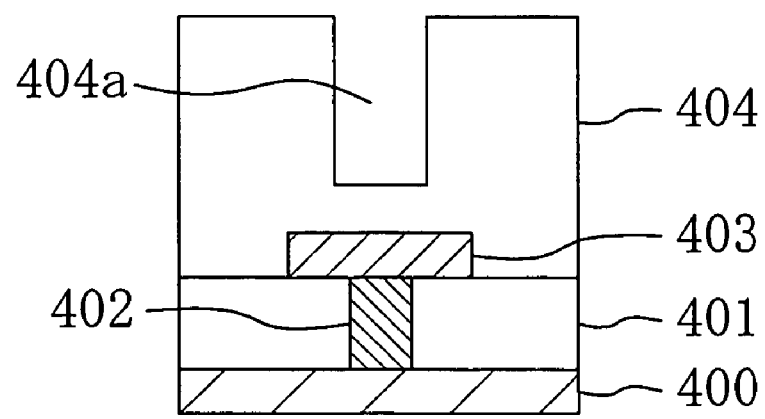
FIGS. 8A and 8B are cross-sectional views each illustrating the method for fabricating a semiconductor device according to the fourth embodiment.

Next, as shown in FIG. 8A, the resist mask 405 is removed by ashing using a plasma composed of a gas containing O.

Figure 8B:
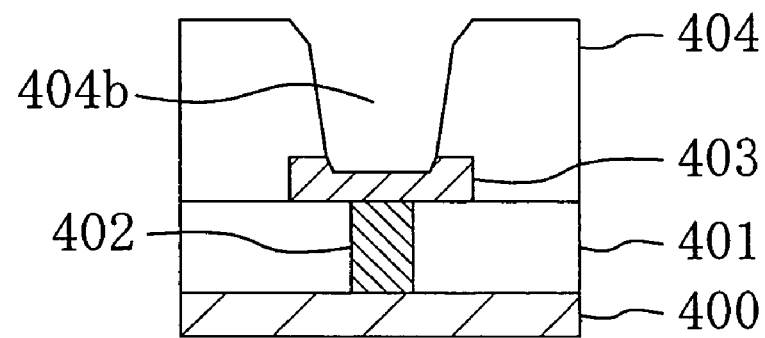

Next, as shown in FIG. 8B, second etching is performed with respect to the second silicon oxide film 404 having the depressed portion 404a without using a mask and by using a plasma composed of a gas mixture of a gas containing C, H, and F and a gas containing O, thereby forming an opening 404b in which the oxygen barrier film 403 is exposed. The opening 404b has a diameter larger than that of the depressed portion 404a and a wall surface having a tapered configuration. In the mean time, the oxygen barrier film 403 is over etched by a thickness of about 30 nm. Then, a lower electrode, a capacitor insulating film, and an upper electrode are formed in the same manner as in the first embodiment. Thereafter, wiring, a protective film, and the like are formed, though they are not disclosed.

Thus, in accordance with the method for fabricating a semiconductor device according to the fourth embodiment, the step of enlarging the diameter of the opening pattern can be omitted so that the number of process steps is reduced compared with that in the first embodiment.

In addition, the depressed portion 404a is formed by the first etching using the resist mask 405 having the first opening pattern 405a and then the second etching is performed after removing the resist mask 405 by ashing. This allows the wall surface of the opening 404b formed in the second silicon oxide film 404 to be formed into a downwardly tapered configuration.

Since the oxygen barrier film 403 is prevented from being exposed when the depressed portion 404a is formed by the first etching, there is no such a situation that the iridium oxide in the upper layer of the multilayer film composing the oxygen barrier film 403 is adhered again to the sidewall of the resist mask 405 or a reaction product between fluorine and iridium is deposited on the sidewall of the resist mask 405 so that configurational abnormality, such as the formation of a fence, as has been observed in the conventional embodiment does not occur. This allows stable formation of the tapered configuration of the wall surface of the opening 404b. As a result, a lower electrode, a capacitor insulating film, and an upper electrode, which are more excellent in coverage, are obtainable so that a broken wire in the electrode as well as a leakage current and a compositional deviation in the capacitor insulating film is prevented and variations in the characteristics of the capacitor are thereby prevented.

Since the oxygen barrier film 403 connected to the semiconductor substrate 400 via the plug 402 is used as the underlying film of the lower electrode, the plug 402 is no more oxidized during the formation of the capacitor insulating film composed of a ferroelectric film or a high dielectric film, which allows a connection between the capacitor and the semiconductor substrate 400.

Since the second silicon oxide film 404 is an oxide film containing silicon as a main component, highly anisotropic etching can be performed with respect to the second silicon oxide film 404. By forming the opening 404b by the second etching after the formation of the depressed portion 404a by the first etching, therefore, the stepped portion at the wall surface of the opening 404b is reduced in level and a smoothly tapered configuration is obtained.

In addition, the planarization of the principal surface of the second silicon oxide film 404 reduces a focus shift in the resist mask 405 used in forming the capacitor composed of the electrodes and the capacitor insulating film or a high dielectric film.

Since the resist mask 405 composed of a photoresist film is used as the mask, the etching selectivity of the resist mask 405 to the insulating film can be maintained sufficiently high.

Since the first etching is performed by using the plasma containing an oxygen gas, the etching selectivity of the resist mask 405 to the second silicon oxide film 404 can also be maintained sufficiently high.

Although the present embodiment has described the case where the capacitor is formed in the opening 404b, the present embodiment is not limited to the formation of the capacitor. Another element may also be formed instead.

Embodiment 5

A method for fabricating a semiconductor device according to a fifth embodiment of the present invention will be described with reference to FIGS. 9A to 9C and FIGS. 10A to 10C.

Figure 9A:
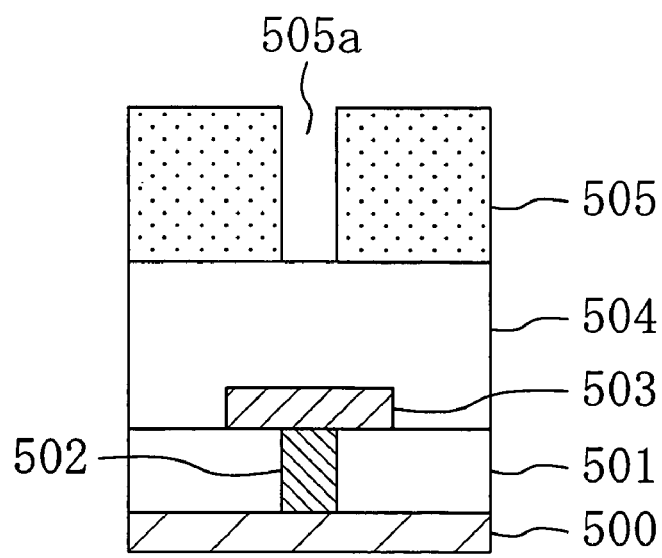
FIG. 9A to 9C are cross-sectional views each illustrating a method for fabricating a semiconductor device according to a fifth embodiment of the present invention.

First, as shown in FIG. 9A, a first silicon oxide film 501, a plug 502, an oxygen barrier film 503, a second silicon oxide film 504, and a resist mask 505 having a first opening pattern 505a with a thickness of 800 nm and an opening diameter of 250 nm are formed on a semiconductor substrate 500 in the same manner as in the description given with respect to FIGS. 1A to 1C in the first embodiment.

Figure 9B:
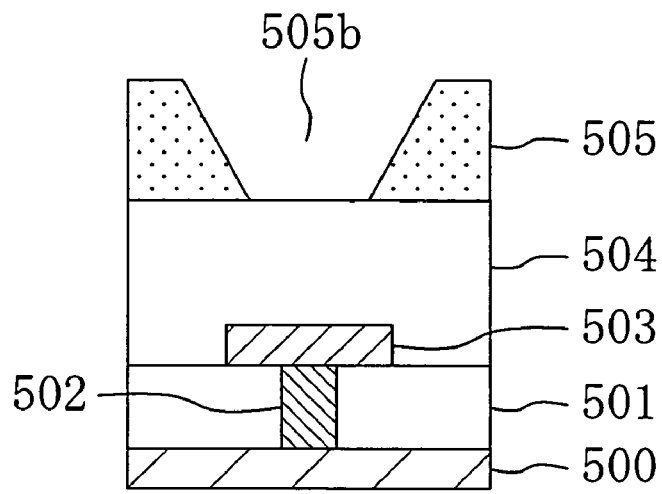

Next, as shown in FIG. 9B, etching using a plasma composed of a gas containing O is performed with respect to the entire surface, thereby removing the portion of the resist mask 505 corresponding to a thickness of about 100 nm and forming the resist mask 505 having a second opening pattern 505b with a diameter of 300 nm. At this time, the cross section of the second opening pattern 505b is formed into a downwardly tapered configuration because an upper portion of the resist mask 505 having the second opening pattern 505b is more frequently exposed to the plasma.

Figure 9C:
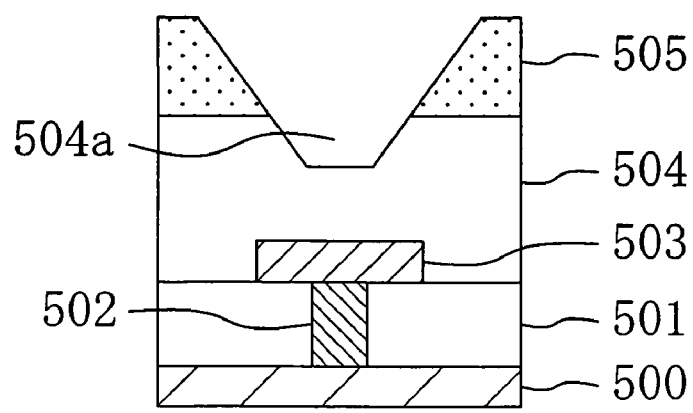

Next, as shown in FIG. 9C, first etching is performed with respect to the second silicon oxide film 504 by using the resist mask 505 having the second opening pattern 505b and a plasma composed of a gas mixture of a gas containing C, H, and F and a gas containing O, thereby forming a depressed portion 504b at a depth of about 300 nm. In this case, the film thickness of the resist mask 505 is reduced to about 500 nm by the first etching, while the tapered configuration of the second opening pattern 505b is transferred to the silicon oxide film 504. This achieves the effect of forming the depressed portion 504a having a tapered wall surface in the silicon oxide film 504.

Figure 10A:
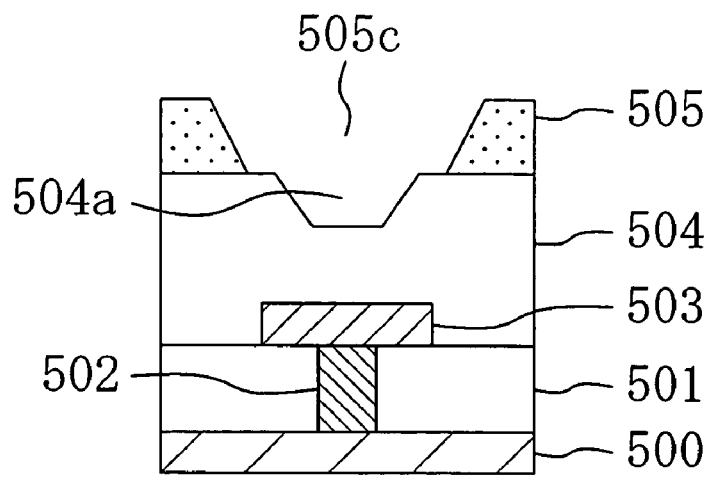
FIGS. 10A to 10C are cross-sectional views each illustrating the method for fabricating a semiconductor device according to the fifth embodiment.

Next, as shown in FIG. 10A, the resist mask 505 is partly removed by a thickness of about 300 nm by using a plasma composed of a gas containing O, thereby forming the resist mask 505 having a third opening pattern 505c having an opening diameter of 400 nm.

Figure 10B:
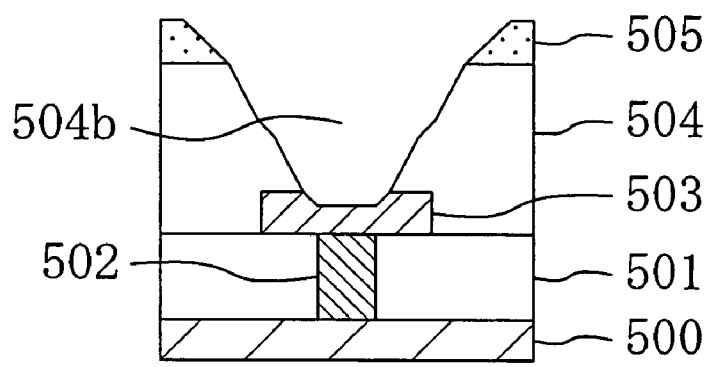

Next, as shown in FIG. 10B, second etching is performed with respect to the second silicon oxide film 504 formed with the depressed portion 504a by using the resist mask 505 having the third opening pattern 505c and a plasma composed of a gas mixture of a gas containing C, H, and F and a gas containing O, thereby forming an opening 504b for exposing the oxygen barrier film 503. The opening 504b has a diameter larger than that of the depressed portion 504a and a wall surface having a tapered configuration. In this case, the film thickness of the resist mask 505 is reduced to about 100 nm by the third etching, while the oxygen barrier film 503 is over etched by a thickness of about 30 nm. Since the second etching is performed with respect to the depressed portion 504a having a tapered wall surface formed by the first etching, a stepped portion at the wall surface of the opening 504b formed by the second etching is reduced in level so that the wall surface of the opening 504b is more gently sloped than the wall surface of the opening 104b formed in the first embodiment.

Figure 10C:
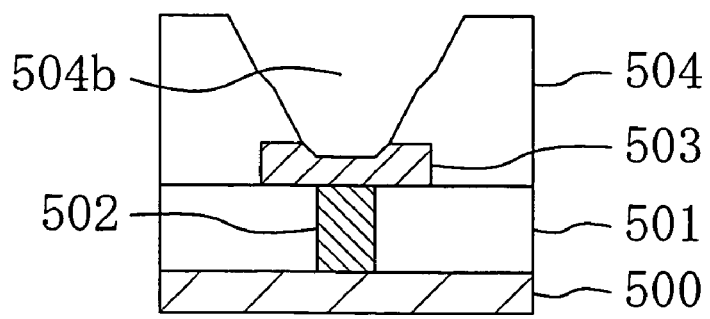

Next, as shown in FIG. 10C, the resist mask 505 is removed by ashing using a plasma composed of a gas containing O. Then, a lower electrode, a capacitor insulating film, and an upper electrode are formed in the same manner as in the first embodiment. Thereafter, wiring, a protective film, and the like are formed, though they are not disclosed.

Thus, since the method for fabricating a semiconductor device according to the fifth embodiment includes the step of forming the opening pattern of the resist mask 505 into a tapered configuration before performing the first etching, the speed at which the second silicon oxide film 504 is removed by the first etching is increased so that an amount of tapering at the wall surface of the depressed portion 504a formed by the first etching is increased compared with that in any of the foregoing embodiments. Since the amount of tapering at the wall surface of the depressed portion 504a is large, the etching gas used in the second etching more easily enters the depressed portion 504a so that the opening 504b having the tapered wall surface with a larger amount of tapering is formed successfully. This allows the formation of a capacitor more excellent in coverage.

Since the oxygen barrier film 503 is prevented from being exposed when the depressed portion 504a is formed by the first etching, there is no such a situation that the iridium oxide in the upper layer of the multilayer film composing the oxygen barrier film 503 is adhered again to the sidewall of the resist mask 505 or a reaction product between fluorine and iridium is deposited on the sidewall of the resist mask 505 so that configurational abnormality, such as the formation of a fence, as has been observed in the conventional embodiment does not occur. This allows stable formation of the tapered configuration of the wall surface of the opening 504b.

In addition, the tapered configuration of the wall surface of the opening 504b can be formed stably. As a result, a lower electrode, a capacitor insulating film, and an upper electrode, which are more excellent in coverage, are obtainable so that a broken wire in the electrode as well as a leakage current and a compositional deviation in the capacitor insulating film is prevented and variations in the characteristics of the capacitor are thereby prevented.

If a metal containing iridium, platinum, gold, ruthenium, rhodium, or palladium as a refractory metal or a metal oxide thereof is used in the upper layer of the multilayer film composing the oxygen barrier metal 503 or if titanium, titanium-aluminum, tantalum, tantalum-aluminum, a nitride thereof, or a multilayer film composed thereof is used in the upper layer of the multilayer film composing the oxygen barrier metal 503, the re-adhesion of the oxygen barrier film 503 removed by the second etching to the sidewall of the resist mask 505 can be suppressed and the deposition of a reaction product between an etching gas and the oxygen barrier film 503 on the sidewall of the resist mask 505 can also be suppressed.

Since the oxygen barrier film 503 connected to the semiconductor substrate 500 via the plug 502 is used as the underlying film of the lower electrode, the plug 502 is no more oxidized during the formation of the capacitor composed of a ferroelectric film or a high dielectric film, which allows a connection between the capacitor and the semiconductor substrate 500.

Since the second silicon oxide film 504 is an oxide film containing silicon as a main component, highly anisotropic etching can be performed with respect to the second silicon oxide film 504. By forming the opening 504*b* by the second etching after the formation of the depressed portion 504*a* by the first etching, therefore, the stepped portion at the wall surface of the opening 504*b* is reduced in level and a smoothly tapered configuration is obtained.

In addition, the planarization of the principal surface of the second silicon oxide film 504 reduces a focus shift in the resist mask 505 used in forming the capacitor composed of the electrodes and the capacitor insulating film or a high dielectric film.

Since the resist mask 505 composed of a photoresist film is used as the mask, the etching selectivity of the resist mask 505 to the insulating film can be maintained sufficiently high.

Since the first etching is performed by using the plasma containing an oxygen gas, the etching selectivity of the resist mask 505 to the second silicon oxide film 504 can be maintained sufficiently high.

Although the present embodiment has described the case where the capacitor is formed in the opening 504*b*, the present embodiment is not limited to the formation of the capacitor. Another element may also be formed instead.

Embodiment 6

A semiconductor device according to a sixth embodiment of the present invention will be described with reference to FIG. 11.

Figure 11:
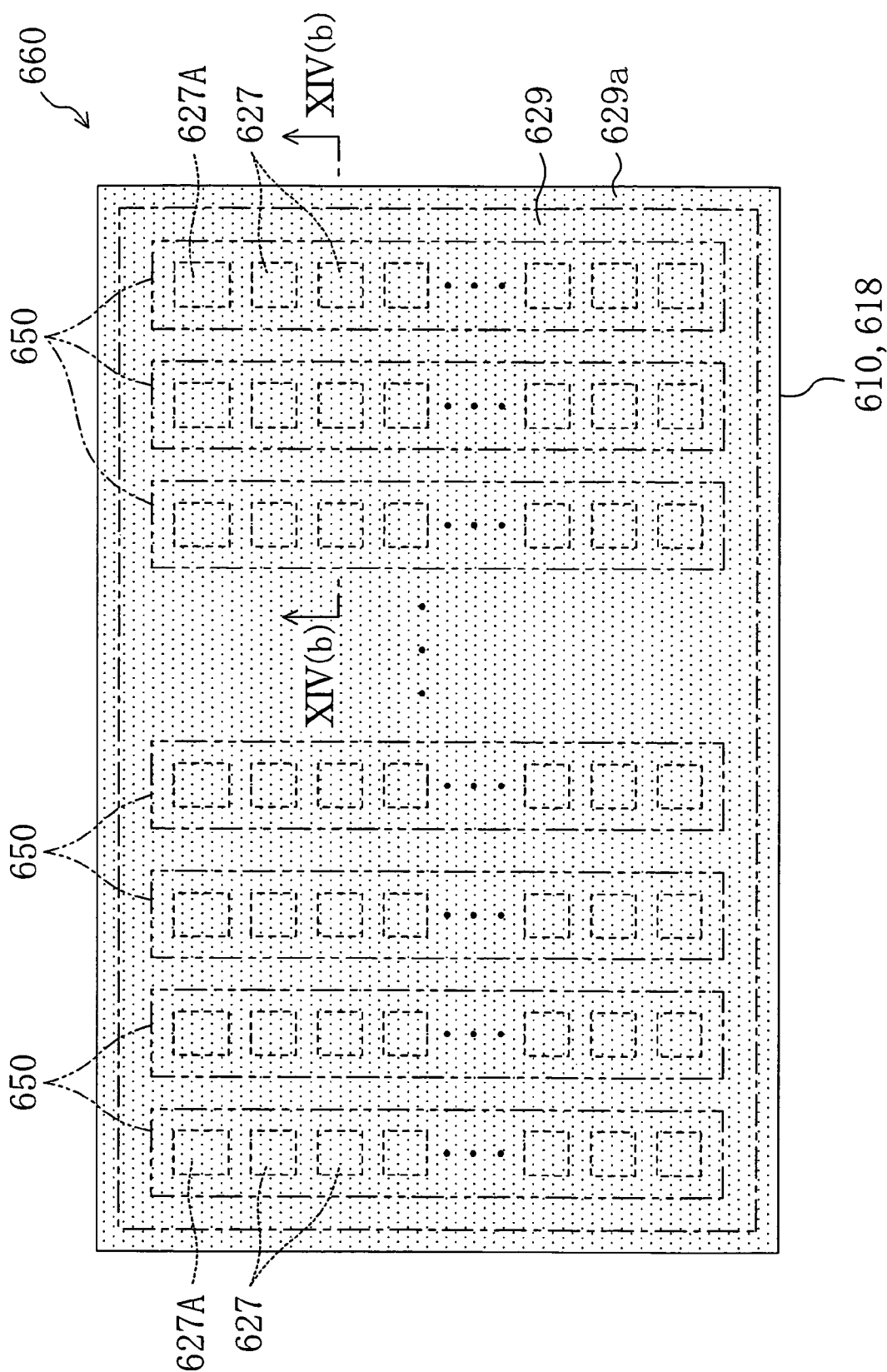
FIG. 11 is a plan view of a cell block in a semiconductor device according to a sixth embodiment of the present invention.

FIG. 11 is a plan view of a cell block in the semiconductor device according to the sixth embodiment.

As shown in FIG. 11, an insulating lower hydrogen barrier film 618 composed of a silicon nitride is formed on a semiconductor substrate 610 composed of, e.g., silicon. A plurality of capacitors 627 arranged as a matrix are formed on the insulating lower hydrogen barrier film 618.

The plurality of capacitors 627 are divided into groups each consisting of, e.g., 65 capacitors 627 arranged in a direction crossing the direction in which a bit line extends, which will be described later. The 65 capacitors 627 belonging to each of the groups have respective upper electrodes electrically connected to each other to compose a cell plate 650. The capacitor 627A positioned at one end portion of each of the cell plates 650 is a dummy capacitor for conduction which provides an electrical connection between the semiconductor substrate 610 and the cell plate 650. Accordingly, the number of the capacitors 627 contained in each of the cell plates 650 is substantially 64. By way of example, one cell block 660 has a configuration such that the 64 cell plates 650 are arranged in the directions in which bit lines extend.

By arranging, e.g., 16 cell blocks 660 in the directions in which the cell plates 650 extend, a capacitor array as a semiconductor memory device is constructed. It will easily be appreciated that the number of the capacitors 627 contained in each of the cell plates 650, the number of the cell plates 650 contained in each of the cell blocks 660, and the number of the cell blocks 660 contained in one capacitor array-are not limited to those described above.

Each of the cell blocks 660 containing the plurality of cell plates 650 is covered with an insulating upper hydrogen barrier film 629 composed of, e.g., a titanium-aluminum oxide (TiAlO) having an insulating property. The insulating upper hydrogen barrier film 629 have ends connected to the ends of the insulating lower hydrogen barrier film 618 at an connecting portion 629*a*. That is, the connecting portion 629*a* is disposed in the peripheral edge portion of the cell block 660.

A description will be given herein below to a method for fabricating the semiconductor device according to the sixth embodiment with reference to FIGS. 12A to 12C, FIGS. 13A and 13B, FIGS. 14A and 14B, and FIG. 15.

FIGS. 12A to 12C, FIGS. 13A and 13B, FIGS. 14A and 14B, and FIG. 15 are cross-sectional views illustrating the individual process steps of the method for fabricating the semiconductor device according to the sixth embodiment. It is to be noted that the cross sections shown in FIGS. 12A to 12C, FIGS. 13A and 13B, FIGS. 14A and 14B, and FIG. 15 are taken in directions crossing the directions in which the cell plates 650 shown in FIG. 11 extend (in the direction in which the bit lines extend). Specifically, a partial view of FIG. 14B showing a range ended at the connecting portion 629*a* and a state yet unformed with a fifth interlayer insulating film 630, which will be described later, corresponds to a cross-sectional view taken along the line XIV(b)-XIV(b) of FIG. 11. In FIGS. 12A to 12C, FIGS. 13A and 13B, FIGS. 14A and 14B, and FIG. 15, the same reference numerals are used to denote the same components as shown in FIG. 11. The description of the same components will not be repeated and, if the same method as used in the foregoing first embodiment is used, the description thereof will not be repeated, either.

—Formation of MOS Transistors—

Figure 12A:
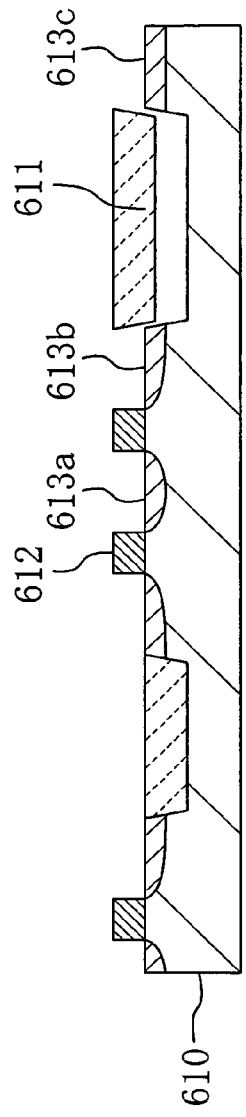
FIGS. 12A to 12C are cross-sectional views each illustrating a method for fabricating the semiconductor device according to the sixth embodiment.

First, as shown in FIG. 12A, trenched portions each at a depth of about 300 nm are formed in the upper surface of the semiconductor substrate 610 by lithography and dry etching. Subsequently, a silicon oxide is deposited by CVD over the entire surface of the semiconductor substrate 610. Then, the silicon oxide is removed by CMP until the surface of the semiconductor substrate 610 is exposed, whereby isolation regions 611 composed of the silicon oxide film buried in the trenched portions are formed selectively.

Next, a gate insulating film (not shown) having a thickness of about 10 nm is formed by, e.g., thermal oxidation on the principal surface of the semiconductor substrate 610. Subsequently, polysilicon having a film thickness of about 200 nm is deposited by low pressure CVD on the gate insulating film and then patterned by lithography and dry etching to form a plurality of gate electrodes 612 composed of the polysilicon.

Next, a silicon oxide having a film thickness of about 50 nm is deposited by CVD over the semiconductor substrate 610 in such a manner as to cover the gate electrodes 612 and then etched back to form sidewall insulating films (not shown) on both sides of the gate electrodes 612.

Next, e.g., arsenic ions at a high concentration are implanted into the semiconductor substrate 610 by using the gate electrodes 612 and the sidewall insulating films as a mask so that drain diffusion layers 613*a* and source diffusion layers 613*b* are formed, whereby MOS transistors are formed. In forming the drain diffusion layers 613*a* and the source diffusion layers 613*b*, a diffusion layer 613*c* for wiring is formed selectively in the active region of the semiconductor substrate 610 except for MOS transistor formation regions.

—Formation of Bit Lines—

Figure 12B:
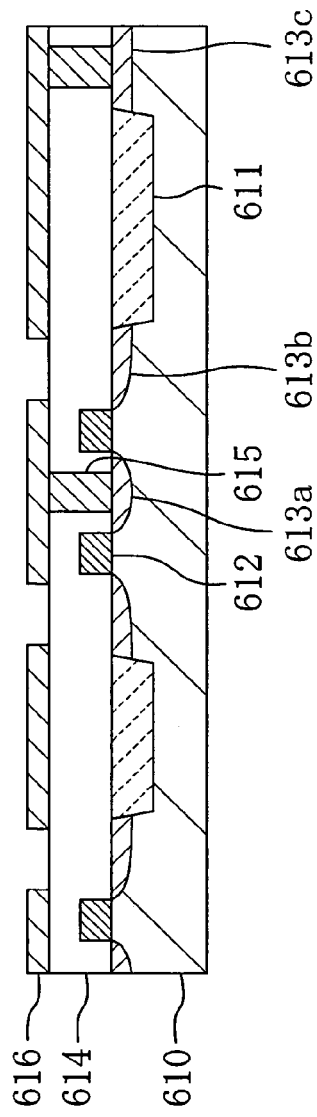

Next, as shown in FIG. 12B, a silicon oxide is deposited by CVD over the entire surface of the semiconductor substrate 610 and then planarized by CMP to have a film thickness which is about 200 nm over the gate electrodes 612, so that a first interlayer insulating film 614 composed of the silicon oxide is formed.

Next, contact holes for exposing the respective surfaces of the drain diffusion layers 613*a* and the diffusion layer 613*c* for wiring are formed in the first interlayer insulating film 614 by lithography and dry etching. Then, a titanium film and a titanium nitride film are deposited successively by CVD on the inner walls of the contact holes such that the contact holes are not filled completely therewith. Subsequently, tungsten is filled in the contact holes. In this manner, first contact plugs 615 each connected to the drain diffusion layer 613*a* or to the diffusion layer 613*c* for wiring are formed, as shown in FIG. 12B.

Next, a multilayer film consisting of a titanium film having a thickness of about 10 nm and a tungsten film having a thickness of about 100 nm, which are stacked successively in ascending order, is formed by sputtering on the first interlayer insulating film 614. Then, the multilayer film is patterned by lithography and dry etching to form bit lines 616 connected to the first contact plugs 615, as shown in FIG. 12B.

—Formation of Insulating Lower Hydrogen Barrier Film—

Figure 12C:
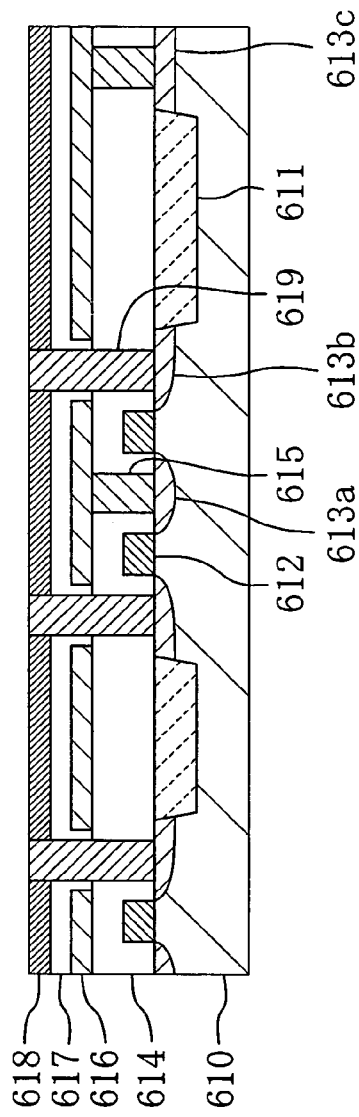

Next, as shown in FIG. 12C, a silicon oxide is formed by CVD over the entire surface of the first interlayer insulating film 614 and then planarized by CMP to have a film thickness which is about 100 nm over the bit lines 616, so that a second interlayer insulating film 617 composed of the silicon oxide is formed.

Next, the insulating lower hydrogen barrier film 618 composed of a silicon nitride having a film thickness of about 100 nm is deposited by CVD on the second interlayer insulating film 617.

Next, contact holes extending through the insulating lower hydrogen barrier film 618, the second interlayer insulating film 617, and the first interlayer insulating film 614 to expose the upper surfaces of the source diffusion layers 613*b* of the MOS transistors are formed by lithography and dry etching. Then, a titanium film, a titanium nitride film, and tungsten are buried successively in the contact holes to form second contact plugs 619 connected to the source diffusion layers 613*b*.

Figure 13A:
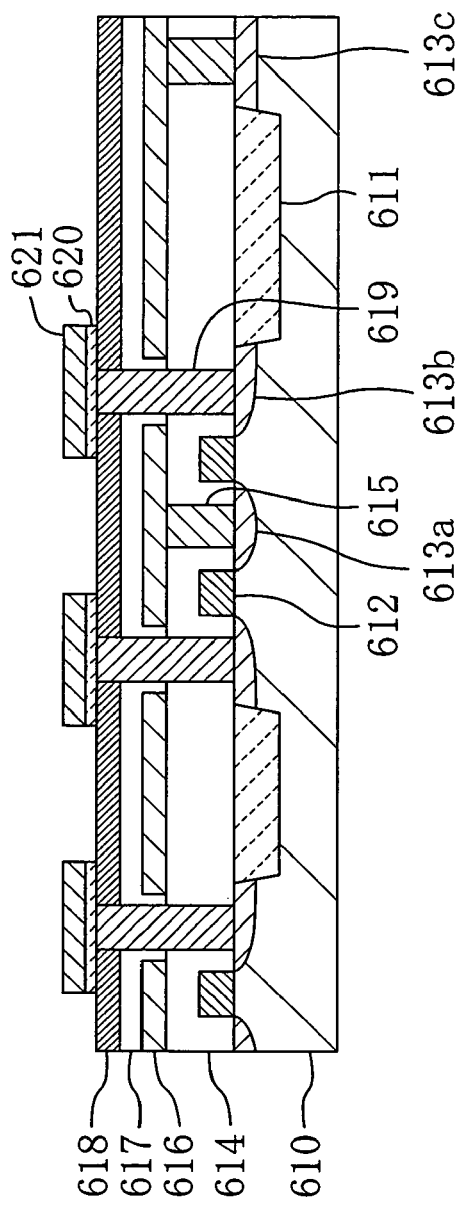
FIGS. 13A and 13B are cross-sectional views each illustrating the method for fabricating the semiconductor device according to the sixth embodiment.

Next, as shown in FIG. 13A, a multilayer film composed of a titanium-aluminum nitride, iridium, and an iridium oxide each having a film thickness of about 50 nm and deposited successively by, e.g., sputtering is formed over the entire surface of the insulating lower hydrogen barrier film 618. Then, the multilayer film is patterned by lithography and dry etching to form conductive lower hydrogen barrier films 620 composed of the titanium-aluminum nitride and oxygen barrier films 621 composed of the iridium and the iridium oxide. The conductive lower hydrogen barrier films 620 are connected to the upper ends of the second contact plugs 619 at the center portions of the lower surfaces thereof and connected to the insulating lower hydrogen barrier film 618 at the peripheral edge portions of the lower surfaces.

—Formation of Capacitors—

Figure 13B:
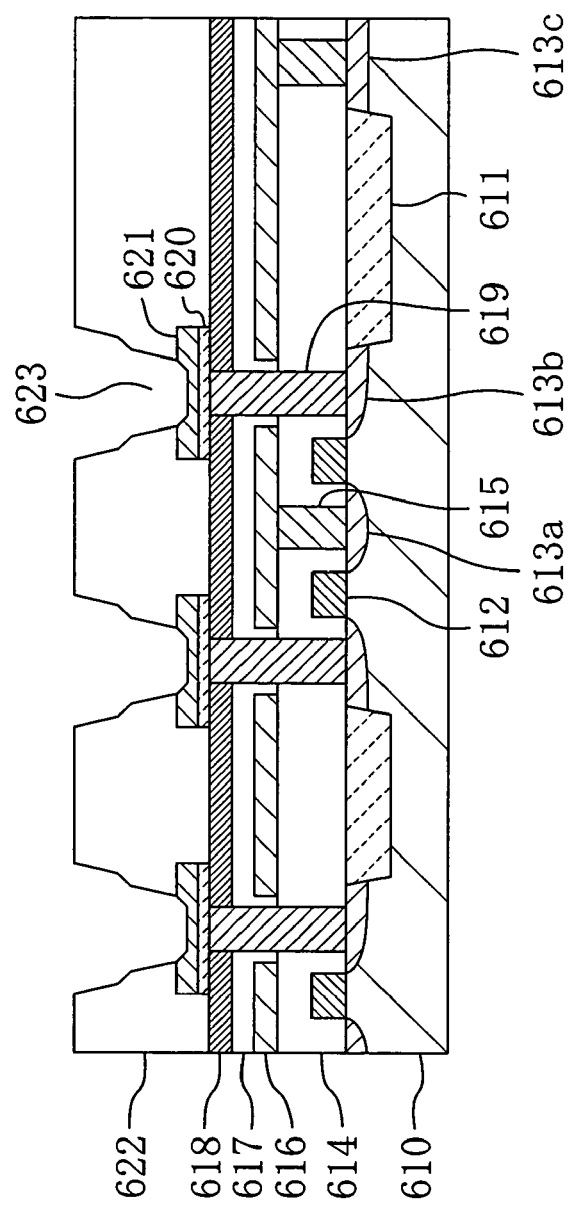

Next, as shown in FIG. 13B, a silicon oxide film having a thickness of 1000 nm is deposited over the entire surface of the insulating hydrogen barrier film 618 in such a manner as to cover the oxygen barrier films 621 and the conductive lower hydrogen barrier films 620. Then, the silicon oxide film is planarized by CMP to have a thickness which is 600 nm over the oxygen barrier films 621, thereby forming a third interlayer insulating film 622.

Next, a resist mask (not shown) having a first opening pattern (not shown) above each of the oxygen barrier films 621 is formed on the third interlayer insulating film 622. Then, first etching is performed by using the first opening pattern to form depressed portions (not shown) each having a depth not reaching the oxygen barrier film 621.

Next, etching is performed with respect to the entire surface of the resist mask having the first opening pattern to enlarge the opening diameter of the first opening pattern and thereby form a resist mask (not shown) having a second opening pattern (not shown) which is larger in opening diameter than the first opening pattern.

Next, second etching is performed with respect to the third interlayer insulating film 622 formed with the depressed portions by using the resist mask having the second opening pattern to form openings 623 for exposing the oxygen barrier film 621. The openings 623 have diameters larger than those of the depressed portions and tapered wall surfaces.

Thus, the openings 623 are formed by forming the depressed portions by the first etching and then performing the second etching with respect to the depressed portions. Consequently, a level difference at the wall surface of each of the openings 623 is reduced, as shown in FIG. 13B.

The process steps in the present embodiment are the same as those illustrated in detail in the first embodiment until the formation of the openings 623 is completed.

Next, as shown in FIG. 14A, an iridium oxide having a film thickness of about 5 nm and platinum having a film thickness of about 50 nm are deposited successively by sputtering over the entire surface of the third interlayer insulating film 622 including the wall and bottom surfaces of the openings 623. The deposited films are then patterned by lithography and dry etching such that at least the portions thereof formed in the openings 623 are left, thereby forming lower electrodes 624 each composed of the iridium oxide and the platinum.

Next, a ferroelectric film composed of a bismuth layer-structured Perovskite-type oxide, having a thickness of about 50 nm, and serving as capacitor insulating films 625 is deposited by metal organic chemical vapor deposition (MOCVD) over the entire surface of the third interlayer insulating film 622 including the openings 623 formed with the lower electrodes 624. The ferroelectric film contains strontium, bismuth, tantalum, or niobium as a main component.

Since the ferroelectric film serving as the capacitor insulating films 625 is thus formed in the openings 623 having the tapered wall surfaces, the ferroelectric film containing the plurality of elements as the components thereof is excellently uniform in thickness and composition. That is, the formation of the openings 623 into the tapered configuration allows the sidewalls of the third interlayer insulating film 622 to be gently sloped at the bent portions of the openings 623 around the bottom surfaces thereof so that the ferroelectric film having a uniform thickness is formed successfully. As a result, the ferroelectric film serving as the capacitor insulating films 625 has a composition which is stable in any region of the openings 623, which allows easy control of the composition of the formed film.

Even if the ferroelectric film serving as the capacitor insulating films 625 is formed by sputtering instead of MOCVD, a ferroelectric film having a uniform thickness can be obtained provided that the openings 623 have a tapered configuration, since sputtered atoms are anisotropic.

Next, platinum having a film thickness of about 50 nm is deposited by sputtering on the ferroelectric film serving as the capacitor insulating films 625. Then, the platinum and the ferroelectric film are patterned to form the capacitor insulating films 625 each composed of the upper electrode 626 made of the platinum and the ferroelectric film. The upper electrodes 626 also serve as the cell plates 650. Although the capacitor insulating films 625 and the upper electrodes 626 are formed by the same patterning step, it is not limited thereto.

Since the lower electrode 624 and the upper electrode 626 are formed in each of the openings 623 having the tapered configuration, it is possible to provide the lower electrode 624 and the upper electrode 626 each having a sufficient thickness over the entire region formed with the capacitor so that a broken wire occurring during the crystallization of the ferroelectric film by high-temperature annealing is prevented reliably.

In this manner, the capacitors 627 each composed of the lower electrode 624, the capacitor insulating film 625, and the upper electrode 626 are formed in the individual openings 623. The capacitors 627 are connected electrically to the source diffusion layers 613b of the MOS transistors via the lower electrodes 624, the oxygen barrier films 621, the conductive lower hydrogen barrier films 620, and the second contact plugs 619.

Although the platinum having a film thickness of about 50 nm is used in the lower electrode 624 and the upper electrode 626, it is also possible to use, instead of the platinum, another platinum group element, i.e., ruthenium (Ru), rhodium (Rh), palladium (Pd), osmium (Os), gold, (Au), iridium (Ir), or an oxide thereof or, alternatively, titanium (Ti), titanium-aluminum (TiAl), tantalum (Ta), tantalum-aluminum (TaAl), a nitride thereof, or a multilayer film composed thereof Preferably, the film thickness of each of the lower electrode 624 and the upper electrode 626 is on the order of 10 nm to 200 nm.

Preferably, the capacitor insulating film 625 is composed of a ferroelectric film or a high dielectric film. For the ferroelectric film, a ferroelectric material of, e.g., $SrBi_2(Ta_xNb_{1-x})_2O_9$, $Pb(Zr_xTi_{1-x})O_3$, $(Ba_xSr_{1-x})TiO_3$, or $(Bi_xLa_{1-x})_4Ti_3O_{12}$ (where X satisfies the relationship represented by $0 \leq x \leq 1$) may be used appropriately. For the high dielectric film, a high dielectric material of, e.g., a tantalum pentaoxide ($Ta_2O_5$) can be used appropriately. Preferably, the thickness of the capacitor insulating film 625 is on the order of 20 nm to 200 nm.

—Formation of Insulating Upper Hydrogen Barrier Film—

Next, as shown in FIG. 14B, a silicon oxide is deposited by CVD over the entire surface of the semiconductor substrate 610 in such a manner as cover the capacitors 627, thereby forming a fourth interlayer insulating film 628.

Subsequently, the portions of the fourth interlayer insulating film 628 and the third interlayer insulating film 622 formed outside the cell block are removed by lithography and dry etching by masking a region covering the cell block (not shown), whereby the end portion of the insulating lower hydrogen barrier film 618 is exposed.

Next, the insulating upper hydrogen barrier film 629 composed of a titanium-aluminum oxide having a film thickness of about 50 nm is deposited by sputtering on the fourth interlayer insulating film 628, the third interlayer insulating film 622, and the exposed surface of the insulating lower hydrogen barrier film 618. As a result, the insulating upper hydrogen barrier film 629 is connected to the insulating lower hydrogen barrier film 618 at the connecting portion 629a at the peripheral edge portion of the cell block.

Next, a silicon oxide is deposited by CVD over the entire surface of the semiconductor substrate 610 in such a manner as to cover the insulating upper hydrogen barrier film 629, thereby forming a fifth interlayer insulating film 630.

—Formation of Wiring—

Figure 15:
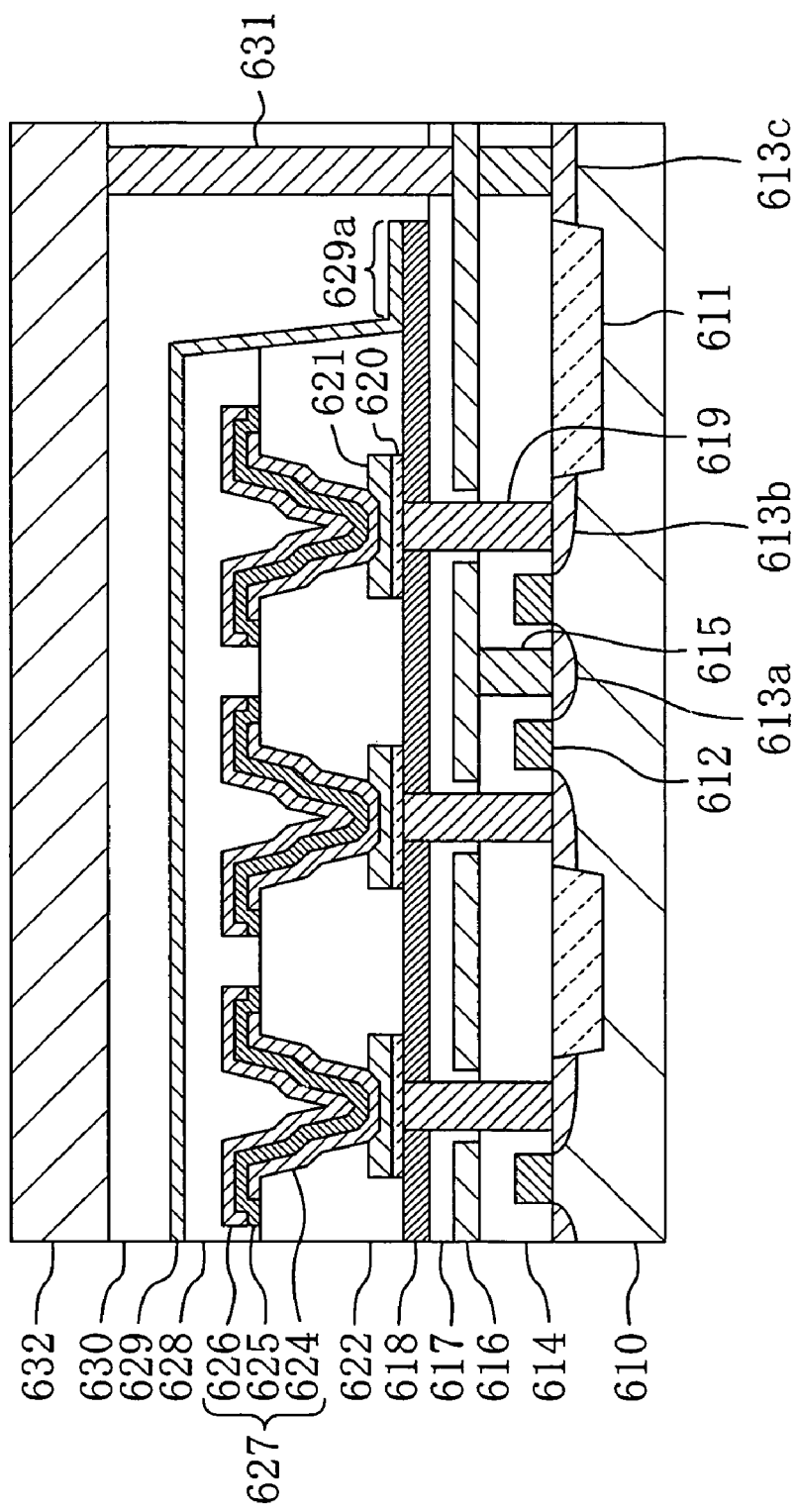
FIG. 15 is a cross-sectional view illustrating the method for fabricating the semiconductor device according to the sixth embodiment.
Figure 16A:
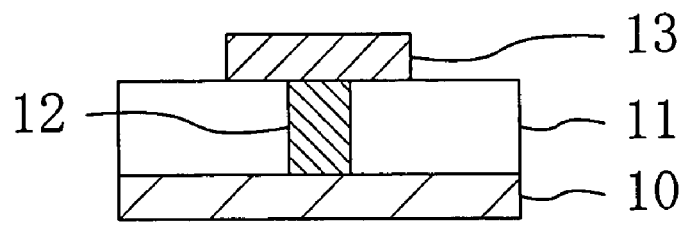
FIGS. 16A to 16C are cross-sectional views each illustrating a conventional method for fabricating a semiconductor device.
Figure 16B:
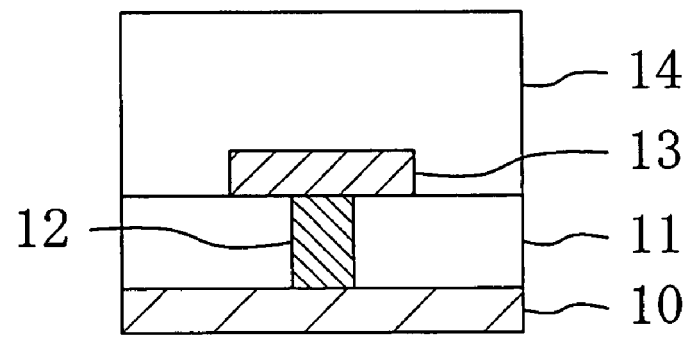
Figure 16C:
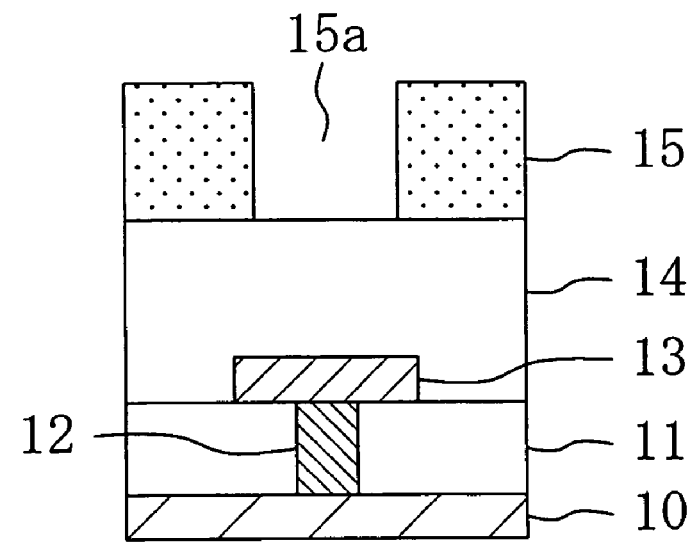
Figure 17A:
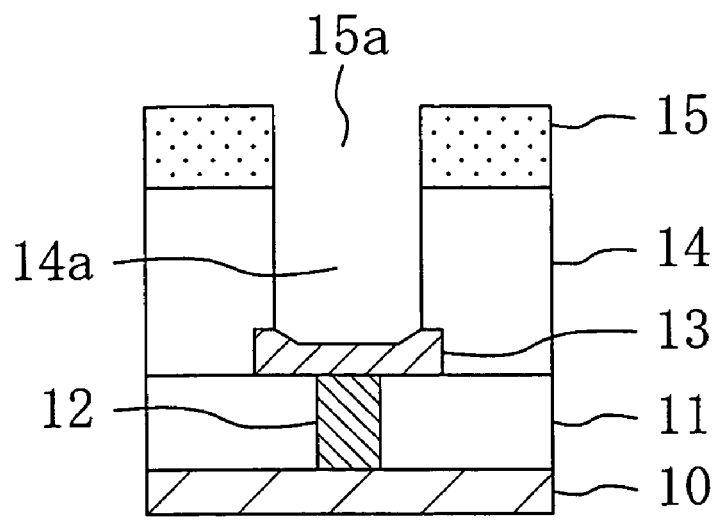
FIGS. 17A to 17C are cross-sectional views each illustrating the conventional method for fabricating a semiconductor device.
Figure 17B:
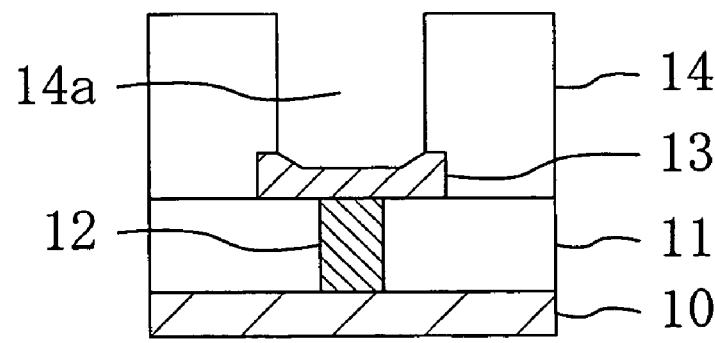
Figure 17C:
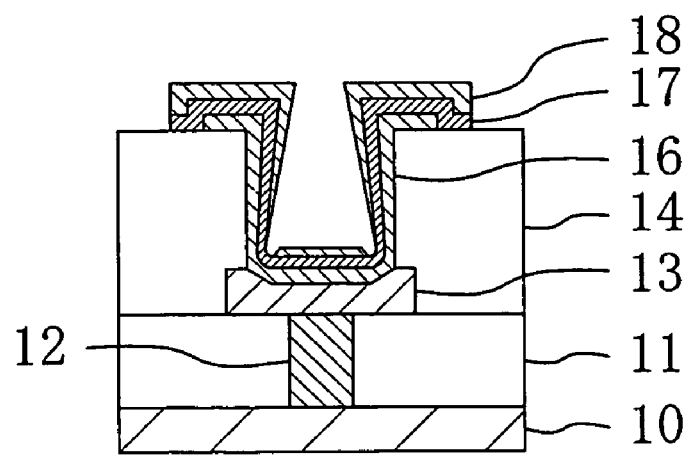

Next, as shown in FIG. 15, a contact hole is formed in the region of the fifth interlayer insulating film 630 formed outside the connecting portion 629a to extend through the fifth and second interlayer insulating films 630 and 617 and expose the upper surface of the bit line 616. Then, a titanium film, a titanium nitride film, and tungsten are buried successively in the contact hole to form a third contact plug 631 connected to the bit line 616. Subsequently, a titanium film having a thickness of about 10 nm, a titanium nitride film having a thickness of about 50 nm, an aluminum film having a thickness of about 500 nm, and a titanium nitride film having a thickness of about 50 nm are deposited successively by sputtering on the fifth interlayer insulating film 630, thereby forming wiring 632 connected to the third contact plug 631.

Thereafter, a desired semiconductor device is obtained by a well-known fabrication process including the formation of multilayer wiring, the formation of a protective film, and the formation of pads.

Thus, in accordance with the method for fabricating the semiconductor device according to the sixth embodiment, the insulating lower hydrogen barrier film 618 is provided under the cell block including the plurality of capacitors 627 and the dummy capacitors 627A for conduction, while the insulating upper hydrogen barrier film 629 connected to the insulating lower hydrogen barrier film 618 at the connecting portion 629a is provided over the cell block and sidewise thereof The arrangement prevents hydrogen generated in the step of wiring formation or the like after the formation of the insulating upper hydrogen barrier film 629 from entering the capacitors 627 and thereby suppresses the degradation of the characteristics of the capacitors 627 resulting from the reduction of the capacitor insulating films 625 by hydrogen.

Since the second contact plugs 619 extending through the insulating lower hydrogen barrier film 618 has upper sidewalls thereof in contact with the insulating lower hydrogen barrier film 618 and upper ends thereof covered with the conductive lower hydrogen barrier film 620, the entrance of hydrogen from between the insulating lower hydrogen barrier film 618 and the conductive lower hydrogen barrier film 620 can be prevented. This prevents the reduction of the capacitor insulating films 625 resulting from the entrance of hydrogen.

In addition, since the capacitors are formed in the openings having tapered wall surfaces in the semiconductor device according to the sixth embodiment, capacitors free from a broken wire can be implemented. Moreover, since the capacitors are enclosed by the hydrogen barrier films, it becomes possible to prevent the entrance of hydrogen into the capacitors and thereby suppress the degradation of the characteristics of the capacitors.

What is claimed is:

1. A method for fabricating a semiconductor device, the method comprising the steps of:
   forming a conductive film on a specified region of a substrate;
   forming an insulating film on the substrate such that the conductive film is covered with the insulating film;
   forming, on the insulating film, a mask layer having a first opening pattern above the conductive film;
   performing first etching with respect to the insulating film by using the mask layer having the first opening pattern to form, in the insulating film, a depressed portion having a bottom portion not reaching the conductive film;
   forming a mask layer having a second opening pattern having an opening diameter larger than an opening diameter of the first opening pattern by enlarging the opening diameter of the first opening pattern;
   performing second etching with respect to the insulating film by using the mask layer having the second opening pattern to form, in the insulating film, an opening for exposing the conductive film; and
   forming, at least in the opening a capacitor element composed of a lower electrode, a capacitor insulating film, and an upper electrode,
   wherein a diameter of the opening increases gradually from the bottom portion toward the top portion, and
   wherein the step of forming the capacitor element includes the steps of:
   forming the lower electrode such that the wall surface of the opening and the bottom surface of the opening are covered with the lower electrode;
   forming the capacitor insulating film on the lower electrode; and
   forming the upper electrode on the capacitor insulating film.

2. The method of claim 1, further comprising, after the step of forming the opening in the insulating film, the steps of:
   forming a mask layer having a third opening pattern having an opening diameter larger than the opening diameter of the second opening pattern by enlarging the opening diameter of the second opening pattern; and
   performing third etching with respect to the insulating film by using the mask layer having the third opening pattern to smooth the wall surface of the opening.

3. The method of claim 1, wherein each of the lower electrode and the upper electrode contains a platinum group element as a main component.

4. The method of claim 1, wherein the capacitor insulating film is composed of a ferroelectric film or a high dielectric film.

5. The method of claim 1, wherein the capacitor insulating film is composed of $SrBi_2(Ta_xNb_{1-x})_2O_9$, $Pb(Zr_xTi_{1-x})O_3$, $(Ba_xSr_{1-x})TiO_3$, $(Bi_xLa_{1-x})_4Ti_3O_{12}$ (where X satisfies a relationship represented by $0 \leq x \leq 1$), or $Ta_2O_5$.

6. The method of claim 1, wherein the conductive film is composed of iridium, platinum, gold, ruthenium, rhodium, palladium, or a metal oxide thereof or alternatively composed of titanium, titanium-aluminum, tantalum, tantalum-aluminum, a nitride thereof, or a multilayer film composed thereof.

7. The method of claim 1, wherein the conductive film contains an oxygen barrier film.

8. The method of claim 1, wherein the insulating film is an oxide film containing silicon.

9. The method of claim 1, wherein the insulating film has a planarized principal surface.

10. The method of claim 1, wherein the mask layer is a photoresist.

11. The method of claim 1, wherein the conductive film is an oxygen barrier film.

12. The method of claim 11, wherein the oxygen barrier film consists of a titanium-aluminum nitride film, an iridium film, and an iridium oxide film.

13. The method of claim 1, further comprising, before the steps of forming the conductive film, the steps of:
   forming a first insulating film on the substrate; and
   forming, in the first insulating film, a plug connecting the substrate,
   wherein the conductive film is formed on the first insulating film and connecting the plug.

14. A method for fabricating a semiconductor device, the method comprising the steps of:
   forming a conductive film on a specified region of a substrate;
   forming an insulating film on the substrate such that the conductive film is covered with the insulating film;
   forming, on the insulating film, a mask layer having a first opening pattern above the conductive film;
   performing first etching with respect to the insulating film by using the mask layer having the first opening pattern to form, in the insulating film, a depressed portion having a bottom portion not reaching the conductive film;
   forming a mask layer having a second opening pattern having an opening diameter larger than an opening diameter of the first opening pattern by enlarging the opening diameter of the first opening pattern; and
   performing second etching with respect to the insulating film by using the mask layer having the second opening pattern to form, in the insulating film, an opening for exposing the conductive film,
   wherein a diameter of the opening increases gradually from the bottom portion toward the top portion, and
   wherein the method further comprises, between the step of forming the mask layer having the first opening pattern and the step of forming the depressed portion in the insulating film, the step of:
   forming a wall surface of the first opening pattern into a tapered configuration.

15. A method for fabricating a semiconductor device, the method comprising the steps of:
   forming a conductive film on a specified region of a substrate;
   forming an insulating film on the substrate such that the conductive film is covered with the insulating film;
   forming, on the insulating film, a mask layer having a first opening pattern above the conductive film;
   performing first etching with respect to the insulating film by using the mask layer having the first opening pattern to form, in the insulating film, a depressed portion having a bottom portion not reaching the conductive film;
   forming a mask layer having a second opening pattern having an opening diameter larger than an opening diameter of the first opening pattern by enlarging the opening diameter of the first opening pattern; and performing second etching with respect to the insulating film by using the mask layer having the second opening pattern to form, in the insulating film, an opening for exposing the conductive film, wherein a diameter of the opening increases gradually from the bottom portion toward the top portion, and wherein the method further comprises, after the step of forming the opening in the insulating film, the step of:

after removing the mask layer, performing third etching with respect to an entire surface of the insulating film to smooth the wall surface of the opening.

16. The method of claim 15, further comprising, after the step of smoothing the wall surface of the opening, the step of:

forming, at least in the opening, a capacitor element composed of a lower electrode, a capacitor insulating film, and an upper electrode.

17. The method of claim 16, wherein the step of forming the capacitor element includes the steps of:

forming the lower electrode such that the wall surface of the opening and the bottom surface of the opening are covered with the lower electrode;

forming the capacitor insulating film on the lower electrode; and forming the upper electrode on the capacitor insulating film.

18. A method for fabricating a semiconductor device, the method comprising the steps of:

forming a conductive film on a specified region of a substrate;

forming an etching stopper film on the conductive film;

forming an insulating film on the substrate such that the etching stopper film is covered with the insulating film;

forming, on the insulating film, a mask layer having a first opening pattern above the conductive film;

performing first etching with respect to the insulating film by using the mask layer having the first opening pattern to form, in the insulating film, a depressed portion having a bottom portion not reaching the etching stopper film;

forming a mask layer having a second opening pattern having an opening diameter larger than an opening diameter of the first opening pattern by enlarging the opening diameter of the first opening pattern;

performing second etching with respect to the insulating film by using the mask layer having the second opening pattern to form, in the insulating film, an opening for exposing the etching stopper film such that the opening has a diameter larger than a diameter of the depressed portion and a wall surface having a tapered configuration; and performing third etching with respect to the etching stopper film and thereby form, in the etching stopper film, an opening for exposing the conductive film, while smoothing the tapered configuration of the wall surface of the opening of the insulating film.

19. The method of claim 18, further comprising the step of:

forming a capacitor element composed of a lower electrode, a capacitor insulating film, and an upper electrode at least in the opening of the insulating film and in the opening of the etching stopper film.

20. The method of claim 19, wherein the step of forming the capacitor element includes the steps of:

forming the lower electrode such that the wall surface of the opening and the bottom surface of the opening are covered with the lower electrode;

forming the capacitor insulating film on the lower electrode; and forming the upper electrode on the capacitor insulating film.

21. The method of claim 18, wherein the third etching is performed after removing the mask layer.

22. The method of claim 18, wherein the third etching is performed by using a mask layer having a third opening pattern formed by enlarging the opening diameter of the second opening pattern.

23. The method of claim 18, further comprising, between the step of forming the mask layer having the first opening pattern and the step of forming the depressed portion in the insulating film, the step of:

forming a wall surface of the first opening pattern into a tapered configuration.

24. The method of claim 18, wherein the etching stopper film is composed of a metal oxide containing titanium or aluminum.

25. A method for fabricating a semiconductor device, the method comprising the steps of:

forming a conductive film on a specified region of a substrate;

forming an insulating film on the substrate such that the conductive film is covered with the insulating film;

forming, on the insulating film, a mask layer having a first opening pattern above the conductive film;

performing first etching with respect to the insulating film by using the mask layer having the first opening pattern to form, in the insulating film, a depressed portion having a bottom portion not reaching the conductive film; and, after removing the mask layer, performing second etching with respect to an entire surface of the insulating film to form, in the insulating film, an opening for exposing the conductive film such that the opening has a diameter larger than a diameter of the depressed portion and a wall surface having a tapered configuration.

26. The method of claim 25, further comprising the step of:

forming, at least in the opening of the insulating film, a capacitor element composed of a lower electrode, a capacitor insulating film, and an upper electrode.

27. The method of claim 26, wherein the step of forming the capacitor element includes the steps of:

forming the lower electrode such that the wall surface of the opening and the bottom surface of the opening are covered with the lower electrode;

forming the capacitor insulating film on the lower electrode; and forming the upper electrode on the capacitor insulating film.

28. The method of claim 25, further comprising, between the step of forming the mask layer having the first opening pattern and the step of forming the depressed portion in the insulating film, the step of:

forming a wall surface of the first opening pattern into a tapered configuration.

29. A method for fabricating a semiconductor device, the method comprising the steps of:

forming a conductive film on a specified region of a substrate;

forming an insulating film on the substrate such that the conductive film is covered with the insulating film;

forming, on the insulating film, a mask layer having a first opening pattern above the conductive film;

performing first etching with respect to the insulating film by using the mask layer having the first opening pattern to form, in the insulating film, a depressed portion having a bottom portion not reaching the conductive film;

forming a mask layer having a second opening pattern having an opening diameter larger than an opening diameter of the first opening pattern by enlarging the opening diameter of the first opening pattern; and performing second etching with respect to the insulating film by using the mask layer having the second opening pattern to form, in the insulating film, an opening for exposing the conductive film, wherein a diameter of the opening increases gradually from the bottom portion toward the top portion, and an obtuse angle is formed between a wall surface of the opening and a bottom surface of the opening at an edge of the bottom surface.

* * * * *